(12) United States Patent
Akagi et al.

(10) Patent No.: US 10,760,981 B2
(45) Date of Patent: Sep. 1, 2020

(54) HALL SENSOR

(71) Applicant: Asahi Kasei Microdevices Corporation, Tokyo (JP)

(72) Inventors: Tsuyoshi Akagi, Tokyo (JP); Takaaki Furuya, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 273 days.

(21) Appl. No.: 15/815,730

(22) Filed: Nov. 17, 2017

(65) Prior Publication Data
US 2018/0143090 A1    May 24, 2018

(30) Foreign Application Priority Data

Nov. 18, 2016    (JP) ................................. 2016-225559
Mar. 23, 2017    (JP) ................................. 2017-058038

(51) Int. Cl.

| | |
|---|---|
| *G01B 7/14* | (2006.01) |
| *G01D 5/14* | (2006.01) |
| *G01R 33/06* | (2006.01) |
| *G01L 1/12* | (2006.01) |
| *H01L 27/22* | (2006.01) |
| *H01L 43/06* | (2006.01) |
| *H01L 43/14* | (2006.01) |

(Continued)

(52) U.S. Cl.
CPC ................ *G01L 1/125* (2013.01); *G01B 7/30* (2013.01); *G01D 5/145* (2013.01); *G01R 33/07* (2013.01); *G01R 33/09* (2013.01); *H01L 27/22* (2013.01); *H01L 43/065* (2013.01); *G01L 3/102* (2013.01)

(58) Field of Classification Search
CPC ... G01B 7/14; G01B 7/30; G01D 5/14; G01R 33/06; G01R 33/07; G01R 33/075; G01R 33/077; G01R 33/09; G01R 33/093; G01L 1/12; H01L 27/22; H01L 43/06; H01L 43/065; H01L 43/14
See application file for complete search history.

(56) References Cited

U.S. PATENT DOCUMENTS

| | | | | |
|---|---|---|---|---|
| 5,198,795 A | * | 3/1993 | Shibasaki | ............. H01L 43/065 257/E43.003 |
| 6,590,389 B1 | * | 7/2003 | Shibasaki | ............. G01R 33/06 257/E43.005 |

(Continued)

FOREIGN PATENT DOCUMENTS

| | | |
|---|---|---|
| JP | S60-175471 A | 9/1985 |
| JP | S62-012974 A | 1/1987 |

*Primary Examiner* — Neel D Shah

(57) ABSTRACT

A Hall sensor having a ball portion on a magnetosensitive portion is provided. A Hall sensor is provided, including: a substrate; a magnetosensitive portion formed on the substrate; an insulating film formed on the magnetosensitive portion; an electrode portion formed on the insulating film; and a ball portion which is provided on the electrode portion and is electrically connected to the electrode portion, wherein in plan view, a projection area of the ball portion accounts for 10% or more of a projection area of the magnetosensitive portion. The projection area of the ball portion may account for 20% or more of the projection area of the magnetosensitive portion. A bonding wire which is electrically connected to the ball portion and is extended from the ball portion in a direction perpendicular to an upper surface of the electrode portion may be further included.

10 Claims, 28 Drawing Sheets

(51) Int. Cl.
    *G01B 7/30*     (2006.01)
    *G01R 33/07*     (2006.01)
    *G01R 33/09*     (2006.01)
    *G01L 3/10*     (2006.01)

(56) References Cited

U.S. PATENT DOCUMENTS

| | | | | |
|---|---|---|---|---|
| 2003/0094943 | A1* | 5/2003 | Ashley | G01R 33/07 |
| | | | | 324/251 |
| 2004/0129934 | A1* | 7/2004 | Takatsuka | G01R 33/07 |
| | | | | 257/40 |
| 2005/0230827 | A1* | 10/2005 | Naito | G01R 33/02 |
| | | | | 257/737 |
| 2007/0170533 | A1* | 7/2007 | Doogue | B82Y 25/00 |
| | | | | 257/422 |
| 2010/0045282 | A1* | 2/2010 | Shibasaki | G01R 33/07 |
| | | | | 324/249 |

* cited by examiner

HALL SENSOR

The contents of the following Japanese patent applications are incorporated herein by reference:
NO. 2016-225559 filed in JP on Nov. 18, 2016, and
NO. 2017-058038 filed in JP on Mar. 23, 2017.

BACKGROUND

1. Technical Field

The present invention relates to a Hall sensor.

2. Related Art

Conventionally, Hall elements having a magnetosensitive portion and including a ball portion on a pad electrode are known (see Patent Documents 1 and 2, for example).

Patent Document 1: Japanese Patent Application Publication No. Sho 60-175471

Patent Document 2: Japanese Patent Application Publication No. Sho 62-12974

However, for a conventional Hall element, light incident to the magnetosensitive portion may cause variation in the characteristics of the Hall element.

SUMMARY

According to a first aspect of the present invention, a Hall sensor is provided, including: a substrate; a magnetosensitive portion formed on the substrate; an insulating film formed on the magnetosensitive portion; an electrode portion formed on the insulating film; and a ball portion which is provided on the electrode portion and is electrically connected to the electrode portion, wherein in plan view, a projection area of the ball portion accounts for 10% or more of a projection area of the magnetosensitive portion.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Example Embodiment 1

Figure 1A:
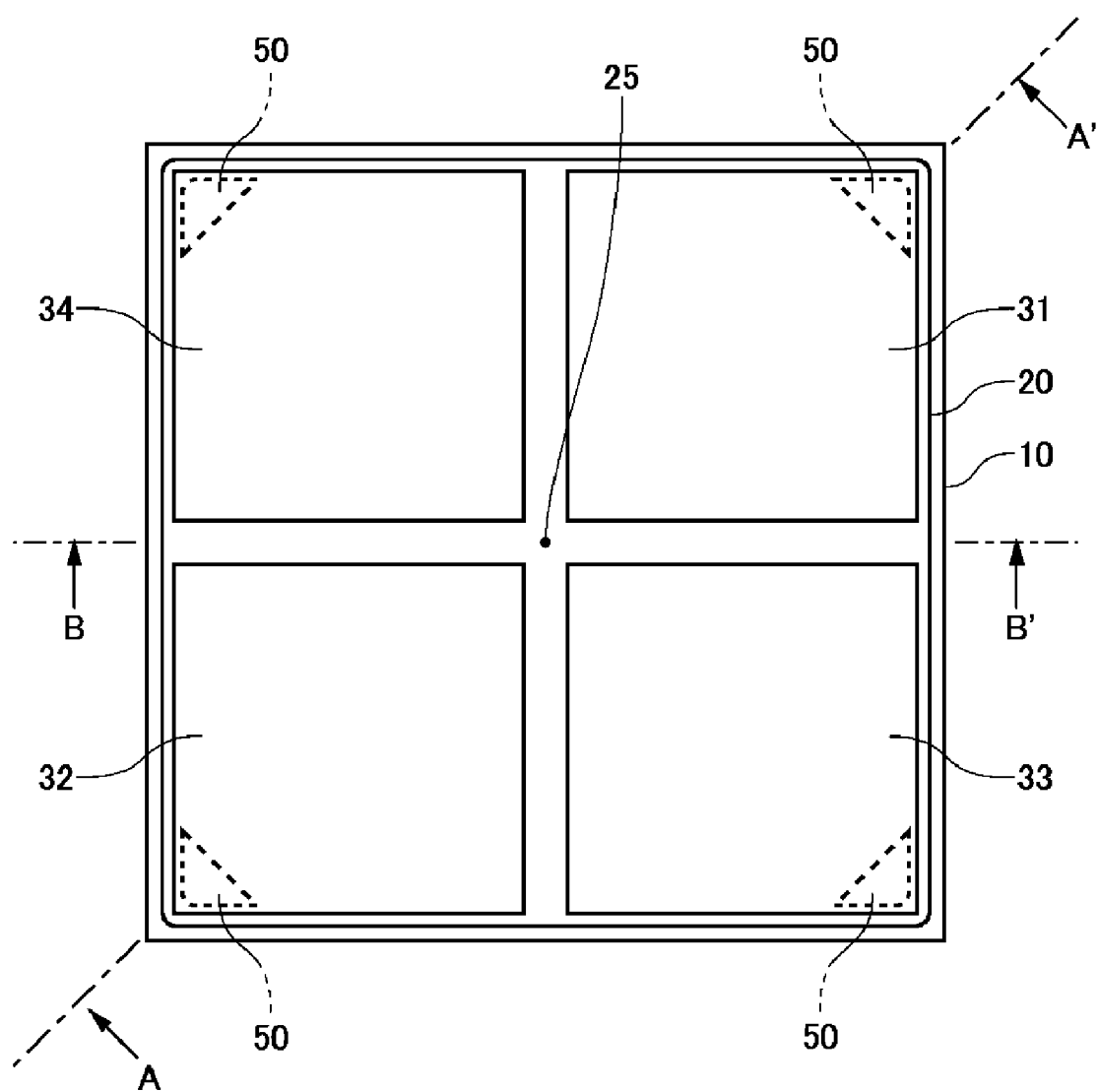
FIG. 1A shows an example of a plan view of a Hall element 100 according to an example embodiment 1.
Figure 1B:
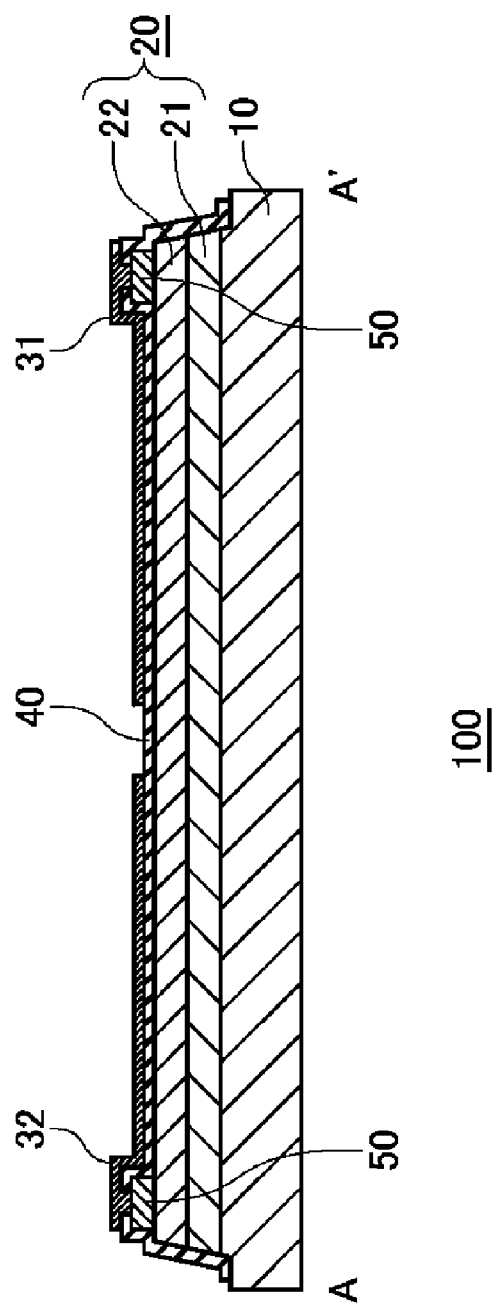
FIG. 1B shows an example of an A-A' cross section of the Hall element 100.
Figure 1C:
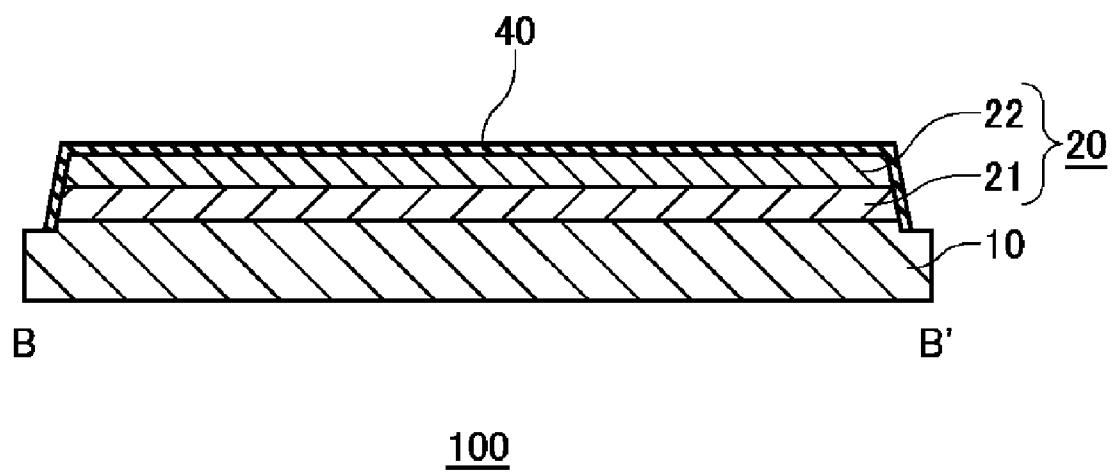
FIG. 1C shows an example of a B-B' cross section of the Hall element 100.

FIG. 1A shows an example of a plan view of a Hall element 100 according to an example embodiment 1. FIG. 1B shows an example of an A-A' cross section of the Hall element 100. FIG. 1C shows an example of a B-B' cross section of the Hall element 100. The Hall element 100 in the present example includes a substrate 10, a magnetosensitive portion 20, electrode portions 31-34, an insulating film 40 and contacts 50. The magnetosensitive portion 20 in the present example includes a conductive layer 21 and a surface layer 22. The electrode portions 31-34 and the contacts 50 constitute a conductive portion.

The substrate 10 is a semiconductor substrate such as Si or a compound semiconductor. The substrate 10 in the present example is a GaAs substrate. In an example, the resistivity of the GaAs substrate is $1.0*10^5$ ohm-cm or more. The upper limit of the resistivity of the GaAs substrate 10 may be $1.0*10^9$ ohm-cm or less. The substrate 10 has a rectangular planar shape. In this specification, the planar shape refers to a shape in plan view. Note that plan view refers to top view.

The magnetosensitive portion 20 is formed on the substrate 10. The magnetosensitive portion 20 may also be formed inside the substrate 10. In an example, the planar shape of the magnetosensitive portion 20 is rectangular, cross-shaped, or the like. The magnetosensitive portion 20 in the present example has a rectangular planar shape. The magnetosensitive portion 20 is a layer having a lower resistance than the substrate 10. In an example, the magnetosensitive portion 20 is formed of a compound semiconductor such as GaAs, InSb and InAs. The magnetosensitive portion 20 in the present example is formed of GaAs. The magnetosensitive portion 20 may be activated by implanting impurities such as Si, Sn, S, Se, Te, Ge and C into the substrate 10 and heating it.

Note that, according to the Hall element 100 in the present embodiment, it is preferable that a region surrounded by four contacts 50 is entirely included in the magnetosensitive portion 20. By forming a shape such that the region surrounded by the four contacts 50 is entirely included in the magnetosensitive portion 20, current concentration can be made unlikely to occur. Also, the area of the magnetosensitive portion 20 relative to that of the substrate 10 can be increased to the maximum extent. This is preferable in that 1/f noises can be suppressed and variation in the output characteristics of the Hall element 100 can be suppressed. As long as the region surrounded by the four contacts 50 is entirely included in the magnetosensitive portion 20, the magnetosensitive portion 20 may extend to the outside of the region surrounded by the four contacts 50. For example, the edge of the magnetosensitive portion 20 may not have a linear shape, and an indentation or the like may be formed in the edge of the magnetosensitive portion 20. The region surrounded by the four contacts 50 can be defined as described below. First, the center of gravity of the magnetosensitive portion 20 in top view is regarded as the center of the magnetosensitive portion 20. Next, a point at which the distance between the center of the magnetosensitive portion 20 and each contact 50 is shortest is marked at each contact 50. A region formed by connecting these points is regarded as the region surrounded by the four contacts 50. Note that, if there are a plurality of points at which the distance from the center of the magnetosensitive portion 20 is shortest at each contact, a region formed by connecting all these points is regarded as the region surrounded by the four contacts 50. Also, if any of the contacts present in the Hall element 100 is not to be used for either input or output, the above-described region may be defined without considering that contact.

The magnetosensitive portion 20 in the present example has a planar shape in which at least one corner is rounded. In this specification, the radius of curvature of a "rounded" corner is not particularly limited as long as the corner has a rounded shape. For example, a "rounded" corner refers to a corner having a radius of curvature with a magnitude of 10% to 10000% of the thickness of the magnetosensitive portion 20. Also, one corner may have a plurality of portions having the above-described radius of curvature. Currents flowing through the Hall element 100 may concentrate at the end of the magnetosensitive portion 20. As the planar shape of the magnetosensitive portion 20 has rounded parts, current concentration at the end of the magnetosensitive portion 20 is mitigated. Note that this effect becomes significant when the magnetosensitive portion 20 is formed in a stepped shape (mesa shape) on the substrate 10. The magnetosensitive portion 20 in the present example has a rectangular planar shape in which four corners are rounded. Note that a center 25 refers to the center point of the planar shape of the magnetosensitive portion 20. This is preferable in that current concentration at the end of the magnetosensitive portion 20 can be mitigated by virtue of having a radius of curvature of 10% or more of the thickness of the magnetosensitive portion 20. This is also preferable in that fluctuation in the output voltage of the Hall element 100 can be suppressed by virtue of having a radius of curvature of 10000% or less of the thickness of the magnetosensitive portion 20. This is because the exposed area of planes other than a plane having the smallest number of dangling bonds ((100) plane, for example) at the side surfaces of the magnetosensitive portion 20 can be reduced and the surface recombination of carriers become unlikely to occur. From the above viewpoint, the radius of curvature is preferably a magnitude of 30 to 5000%, and more preferably 50 to 1000%. Also, if the planar shape of the magnetosensitive portion 20 is rectangular in particular, the amount of current flowing at the end of the magnetosensitive portion 20 is increased, and therefore a significant effect of mitigating current concentration can be obtained.

The conductive layer 21 is formed on the substrate 10. The conductive layer 21 in the present example is n-type GaAs. The film thickness of the conductive layer 21 is not particularly limited. The film thickness of the conductive layer 21 in the present example is 50 nm or more and 2000 nm or less. The film thickness of the conductive layer 21 may also be 100 nm or more and 1000 nm or less.

The surface layer 22 is formed of a conductive material and is formed on the conductive layer 21. The surface layer 22 consists of a high-resistance crystal having a lower conductivity than the conductive layer 21 such as a GaAs, AlGaAs or AlAs layer. The film thickness of the surface layer 22 in the present example is 150 nm or more. The film thickness of the surface layer 22 may also be 200 nm or more. The upper limit of the film thickness of the surface layer 22 may be 800 nm or less or may be 600 nm or less. Note that the surface layer 22 may not be formed in the magnetosensitive portion 20.

The insulating film 40 is formed on the magnetosensitive portion 20. The insulating film 40 in the present example is formed on the surface layer 22. The insulating film 40 is provided with openings for contact. In an example, the thickness of the insulating film 40 is 100 nm or more, but is not so limited. For example, the insulating film 40 is a multilayer film formed by laminating a silicon nitride film ($Si_3N_4$ film), a silicon oxide film ($SiO_2$ film), an alumina film ($Al_2O_3$), and a polyimide film or at least one of these films. Note that, for the sake of brevity, the insulating film 40 is omitted in plan view.

The electrode portions 31-34 are formed on the insulating film 40. In an example, the electrode portion 31 and electrode portion 32 are input electrode portions for passing a current through the magnetosensitive portion 20. In this case, the electrode portion 33 and electrode portion 34 are output electrode portions for detecting the Hall voltage of the magnetosensitive portion 20. In this specification, the electrode portion 31 and electrode portion 32 are described as input electrode portions and the electrode portion 33 and electrode portion 34 are described as output electrode portions, but the input and output electrodes may be switched. Note that the Hall element 100 may have electrode portions other than the above ones.

Figure 1D:
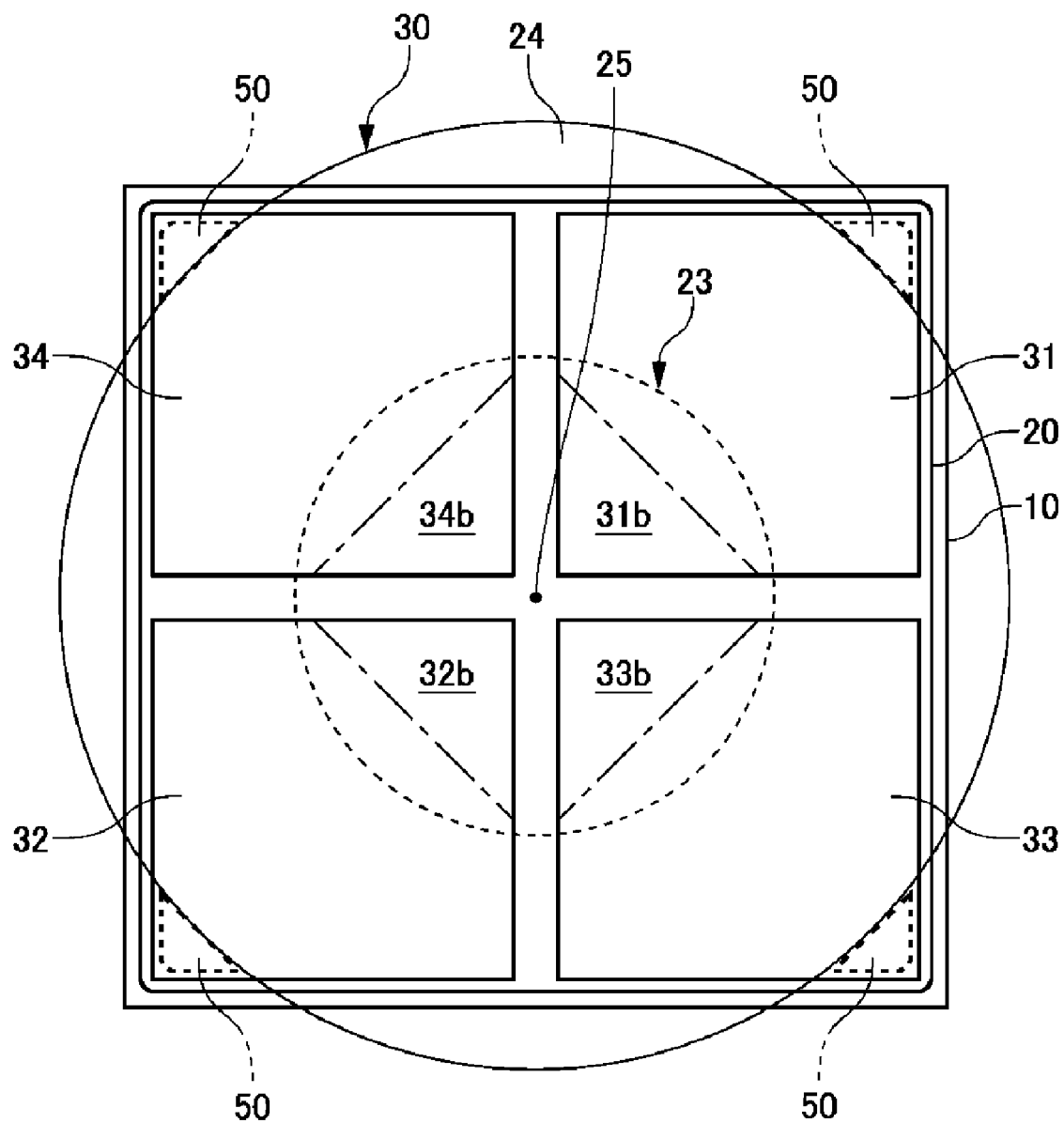
FIG. 1D is an example of a central region 23 of the Hall element 100 according to the example embodiment 1.
Figure 1E:
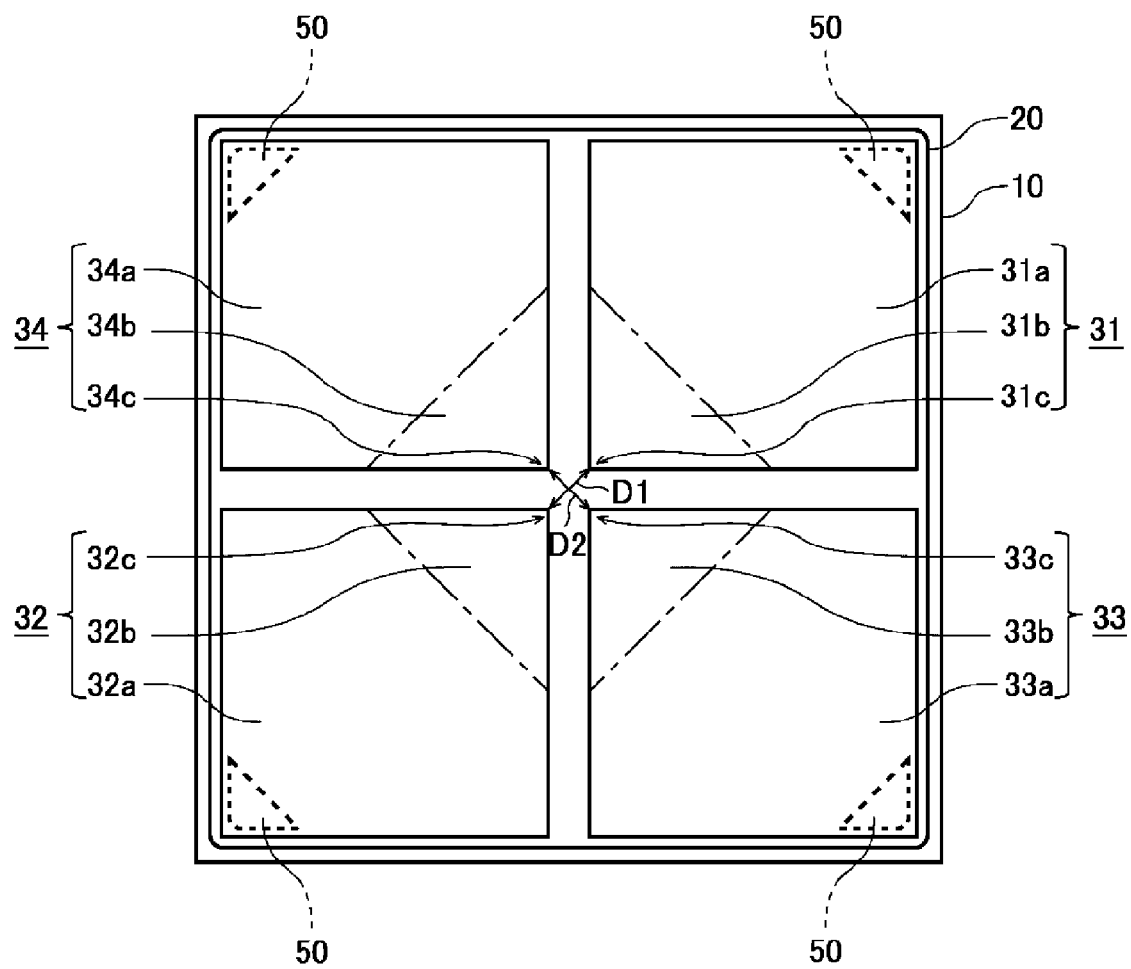
FIG. 1E is a plan view showing an example of the configuration of the electrode portions 31-34.

FIG. 1D is an example of a central region 23 of the Hall element 100 according to the example embodiment 1. FIG. 1E is a plan view showing an example of the configuration of the electrode portions 31-34.

The magnetosensitive portion 20 includes a central region 23 including the center 25 of the magnetosensitive portion 20 in plan view and a peripheral region 24 positioned around the central region 23. The central region 23 is, in particular, a main region that contributes to the Hall effect in the magnetosensitive portion 20. A region outside the central region 23 is regarded as the peripheral region 24.

In an example, the central region 23 has a planar shape that is perfectly circular. The central region 23 in the present example is shown as an interior region of a circle indicated by dashed line. The central region 23 defines an auxiliary circle 30, which is a circle whose center is at the same position as the center 25 of the magnetosensitive portion 20 and whose radius is the shortest distance from the center of gravity of the magnetosensitive portion 20 to each contact 50, in plan view. The central region 23 is regarded as an interior region of a circle whose diameter has a length of ½ of that of the auxiliary circle 30 and whose center is at the center of gravity of the magnetosensitive portion 20. Note that the geometrical center of gravity of the magnetosensitive portion 20 can be calculated in a figure enclosed by the boundary between the magnetosensitive portion 20 and the substrate 10 in plan view. Note that the central region 23 may have a rectangular planar shape. Here, each electrode portion has a portion extending toward the above-described central region 23. That is, each electrode portion has a portion extending closer to the central region 23 of the magnetosensitive portion 20 than a portion at which the outermost surface of the magnetosensitive portion 20 and a conductive portion (or the contacts 50) are in contact in plan view.

The electrode portion 31 and the electrode portion 32 face each other in a first direction. The electrode portion 33 and the electrode portion 34 face each other in a second direction that crosses (for example, is orthogonal to) the first direction in plan view. The electrode portions 31-34 each extend from the peripheral region 24 to the central region 23 of the magnetosensitive portion 20.

That is, the electrode portion 31 includes a main portion 31a and an extending portion 31b that extends from the main portion 31a to the central region 23 of the magnetosensitive portion 20. The electrode portion 32 includes a main portion 32a and an extending portion 32b that extends from the main portion 32a to the central region 23 of the magnetosensitive portion 20. The electrode portion 33 includes a main portion 33a and an extending portion 33b that extends from the main portion 33a to the central region 23 of the magnetosensitive portion 20. The electrode portion 34 includes a main portion 34a and an extending portion 34b that extends from the main portion 34a to the central region 23 of the magnetosensitive portion 20.

As shown in FIG. 1E, assuming that the separation distance between the electrode portion 31 and the electrode portion 32 (that is, the separation distance between the extending portions 31b and 32b) in the first direction is referred to as D1, and the separation distance between the electrode portion 33 and the electrode portion 34 (that is, the separation distance between extending portions 33b and 34b) in the second direction is referred to as D2, D1 and D2 are each 1 μm or more and 40 μm or less.

The electrode portion 31, the electrode portion 32, the electrode portion 33 and the electrode portion 34 have a rectangular planar shape. A corner portion 31c included in the electrode portion 31, a corner portion 32c included in the electrode portion 32, a corner portion 33c included in the electrode portion 33 and a corner portion 34c included in the electrode portion 34 are each positioned above the magnetosensitive portion 20.

Here, the corner portion 31c is a portion included in the extending portion 31b of the electrode portion 31. The corner portion 32c is a portion included in the extending portion 32b of the electrode portion 32. The corner portion 33c is a portion included in the extending portion 33b of the electrode portion 33. The corner portion 34c is a portion included in the extending portion 34b of the electrode portion 34. As shown in FIG. 1E, the corner portion 31c, the corner portion 32c, the corner portion 33c and the corner portion 34c are arranged being adjacent to each other. The corner portion 31c is adjacent to the corner portion 33c and the corner portion 34c, the corner portion 32c is adjacent to the corner portion 33c and the corner portion 34c, the corner portion 31c and the corner portion 32c face each other in the first direction, and the corner portion 33c and the corner portion 34c face each other in the second direction.

In plan view, the central position of a region surrounded by the corner portion 31c, the corner portion 32c, the corner portion 33c and the corner portion 34c overlaps with the center 25 of the magnetosensitive portion 20. In plan view, the outer perimeter of each of the electrode portion 31, the electrode portion 32, the electrode portion 33 and the electrode portion 34 is positioned inside a region enclosed by the outer perimeter of the magnetosensitive portion 20.

The electrode portions 31-34 are each arranged at corresponding one of the four corners of the rectangle of the substrate 10. Each side of the electrode portions 31-34 is arranged to be parallel or perpendicular to sides of the substrate 10. If the electrode portions 31-34 are formed on the magnetosensitive portion 20, the magnetosensitive portion 20 can suppress the effect of chipping by virtue of having at least one rounded corner. Here, dicing is to be performed to divide the substrate 10 into individual pieces, where, if the electrode portions 31-34 are not present between the outer perimeter of the substrate 10 and the outer perimeter of the magnetosensitive portion 20, the magnetosensitive portion 20 may be chipped, and current concentration due to the chipping may occur. In particular, if corners of the magnetosensitive portion 20 are not rounded, stress from the insulating film 40 and stress generated in the dicing may concentrate at the corners of the magnetosensitive portion, which may form an origin of cracking. If at least one corner of the magnetosensitive portion 20 is rounded, current concentration can be mitigated by mitigating the above-described stresses or the like to suppress chipping at the end of the magnetosensitive portion 20. The electrode portions 31-34 have the same planar shape in the present example, but may have different planar shapes. For example, the input electrode portions and the output electrode portions may have planar shapes different from each other. The electrode portions 31-34 are electrically connected to the magnetosensitive portion 20 through the openings provided in the insulating film 40. The electrode portions 31-34 in the present example are electrically connected to the magnetosensitive portion 20 via the contacts 50. The electrode portions 31-34 are formed of a conductive material such as metal or polysilicon. The electrode portions 31-34 in the present example contain gold as their main component.

Although the electrode portions 31-34 are formed on the magnetosensitive portion 20 in plan view in the present example embodiment, at least parts of these electrode portions may extend to a region outside the magnetosensitive portion 20 in plan view. Note that it is preferable that the electrode portions 31-34 are formed on the magnetosensitive portion 20 in plan view in that fluctuation in the output voltage of the Hall element 100 can be reduced. This is because stress due to difference between the coefficients of thermal expansion of the magnetosensitive portion 20 and the electrode portions 31-34 becomes unlikely to applied on the magnetosensitive portion 20.

The contacts 50 are formed on the magnetosensitive portion 20. The contacts 50 electrically connect the electrode portions 31-34 and the magnetosensitive portion 20. The contacts 50 penetrate the insulating film 40 to electrically connect the electrode portions 31-34 and the magnetosensitive portion 20. The contacts 50 in the present example are formed of the same material as the the electrode portions 31-34, for example. The electrode portions 31-34 and the contacts 50 may be formed as a conductive portion, by the same process and at the same time. However, the contacts 50 may be formed of a material different from that of the electrode portions 31-34. The contacts 50 include a plurality of input contacts for inputting a current to the magnetosensitive portion 20 and a plurality of output contacts for outputting a Hall electromotive force according to the input current. In the present example, the electrode portion 31 and the electrode portion 32 are input contacts, and the electrode portion 33 and the electrode portion 34 are output contacts. However, the Hall element 100 may perform a spinning current operation by switching the input contacts and the output contacts. Note that the Hall element 100 may have contacts other than the above ones.

Each contact 50 has a planar shape according to the planar shape of the magnetosensitive portion 20. The planar shape according to the planar shape of the magnetosensitive portion 20 may be the same shape as the magnetosensitive portion 20. The planar shape of each contact 50 in the present example has a rounded part at at least a part of an outer region positioned closer to the outer perimeter of the magnetosensitive portion 20. The planar shape of each contact 50 may also have a rounded part at an inner region positioned closer to the center 25 of the magnetosensitive portion 20. This mitigates current concentration at the end of the magnetosensitive portion 20. In particular, if the planar shape of the magnetosensitive portion 20 is rectangular or if the region surrounded by the four contacts 50 is entirely included in the magnetosensitive portion 20, the amount of current flowing at the end of each contact 50 is increased, and therefore a significant effect of mitigating current concentration can be obtained. The planar shape of each contact 50 is not limited by the present example as long as it can mitigate current concentration at the end of each contact 50. Note that, in this specification, the outer region refers to a region of the outer perimeter of each contact 50 facing the outer perimeter of the magnetosensitive portion 20. On the other hand, the inner region refers to a region other than the outer region and positioned closer to the center 25 of the magnetosensitive portion 20.

As described above, the Hall element 100 in the present example mitigates current concentration in the magnetosensitive portion 20. In this manner, miniscule variation in resistance due to current concentration in the magnetosensitive portion 20 becomes unlikely to occur. Accordingly, the Hall element 100 in the present example can suppress 1/f noises caused by current concentration.

Figure 2A:
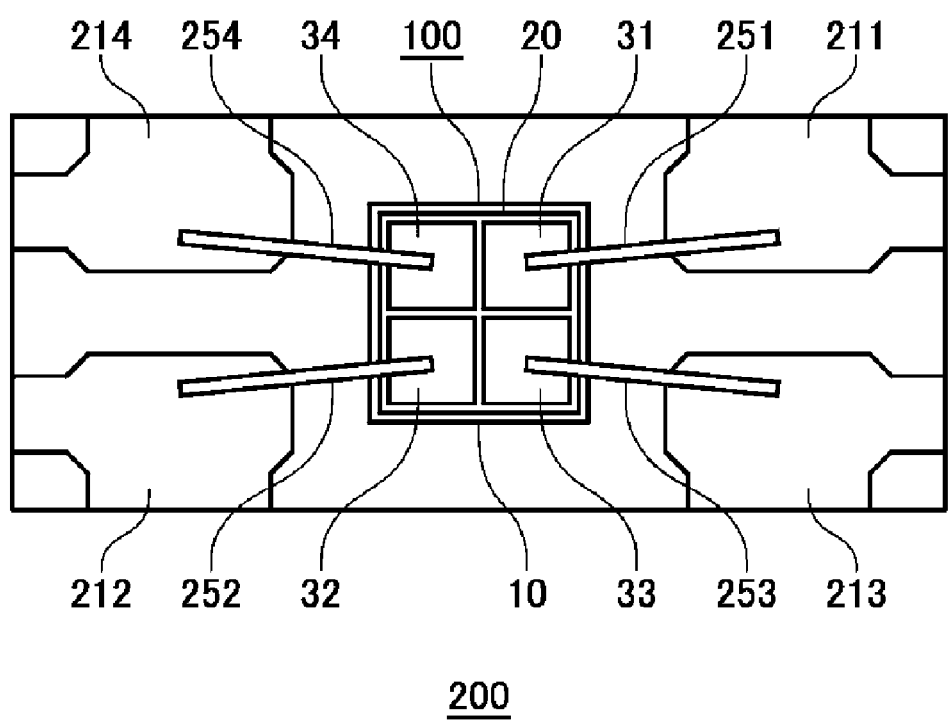
FIG. 2A shows an example of a plan view of a Hall sensor 200.
Figure 2B:
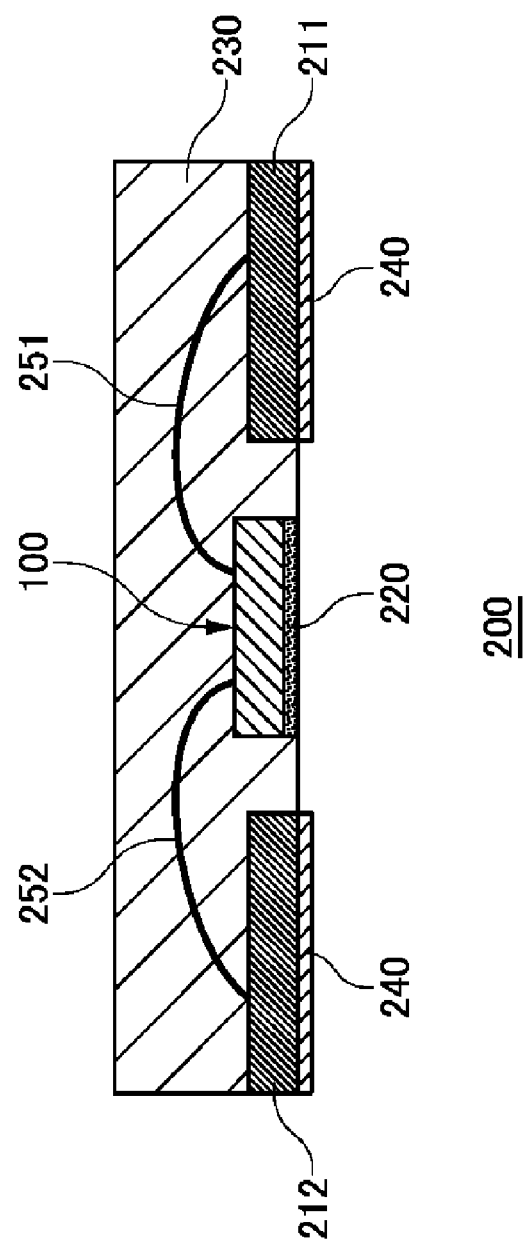
FIG. 2B is an example of a cross-sectional view of the Hall sensor 200.

FIG. 2A shows an example of a plan view of a Hall sensor 200. FIG. 2B is an example of a cross-sectional view of the Hall sensor 200. The Hall sensor 200 includes the Hall element 100, lead terminals 211-214, a passivation layer 220, a molding member 230, exterior plating layers 240 and bonding wires 251-254. Note that the configuration of the Hall sensor 200 in the present example is an example and is not so limited.

The Hall element 100 is connected to the lead terminals 211-214 by the bonding wires 251-254. The electrode portion 31 in the present example is electrically connected to the lead terminal 211 by the bonding wire 251. The electrode portion 32 is electrically connected to the lead terminal 212 by the bonding wire 252. The electrode portion 33 is electrically connected to the lead terminal 213 by the bonding wire 253. The electrode portion 34 is electrically connected to the lead terminal 214 by the bonding wire 254.

The bonding wires 251-254 are formed of a conductive material. The bonding wires 251-254 in the present example are gold wires, but are not so limited. The bonding wires 251-254 are covered with the molding member 230. In this manner, the bonding wires 251-254 are fixed.

The lead terminals 211-214 are electrically connected to external components via the exterior plating layers 240. The exterior plating layers 240 are formed on surfaces of the lead terminals 211-214 that are opposite to surfaces to which the bonding wires 251-254 are connected. In this manner, the Hall element 100 is electrically connected to components external to the Hall sensor 200. Note that, the exterior plating layers 240 are formed of tin (Sn) in the present example, but are not so limited.

The passivation layer 220 covers a surface of the Hall element 100 that is opposite to a surface to which the bonding wires 251-254 are connected. In an example, the material of the passivation layer 220 is not limited as long as it can passivate the substrate 10. The passivation layer 220 may be a film consisting of any one of a conductor, insulator or semiconductor, or may be a film including two or more of these. In the case of a conductor, the passivation layer 220 may be a conductive resin such as a silver paste. In the case of an insulator, the passivation layer 220 is an insulative paste including an epoxy-based thermal curing resin and silica ($SiO_2$), silicon nitride and silicon dioxide or the like. In the case of a semiconductor, the passivation layer 220 may be a lamination of a Si substrate and a Ge substrate or the like.

The molding member 230 molds the Hall element 100, the bonding wires 251-254 and the lead terminals 211-214. The molding member 230 is formed of a material which can withstand high heat during reflow. For example, the molding member 230 is formed of an epoxy-based thermal curing resin.

Here, if the thickness of the Hall sensor 200 is reduced, the thickness of the molding member 230 on the Hall element 100 is thin, and therefore electromagnetic waves including light incident to the magnetosensitive portion 20 of the Hall element 100 may vary the local conductivity of the magnetosensitive portion 20 due to the photoelectric effect. This variation generates an offset voltage Vu in the Hall element 100.

In contrast, according to the present example, the electrode portions 31-34 extend from the peripheral region 24 to the central region 23 of the magnetosensitive portion 20, and a part of the central region 23 is covered by the electrode portions 31-34, in plan view. For example, the electrode portions 31-34 are formed extending from the four corners of the rectangular substrate 10 to the central region 23 of the magnetosensitive portion 20. At the central region 23, the extending portions 31b-34b of the electrode portions 31-34 are arranged close to each other, and gaps between adjacent electrodes are narrow. In this manner, a part of the central region 23 of the magnetosensitive portion 20 is covered by the electrode portions 31-34.

Here, metal used as a material of the electrode portions absorbs electromagnetic waves including light very well. Accordingly, the electrode portions 31-34 can block electromagnetic waves incident to the magnetosensitive portion 20 of the Hall element 100 to suppress the local conductivity variation in the magnetosensitive portion 20. In this manner, an effect of suppressing variation in the offset voltage Vu is obtained.

In particular, if the ratio of the total area of the electrode portions 31-34 on the central region 23 of the magnetosensitive portion 20 relative to the area of the central region 23 is 10% or more and less than 100% in plan view, the effect of suppressing variation in the offset voltage Vu is enhanced. The ratio is preferably 20% or more and 99% or less, and more preferably 40% or more and 95% or less.

It is also preferable that, in plan view, the ratio of the area of a part of the effective region below the electrode portions 31-34 relative to the area of the entire effective region of the magnetosensitive portion 20 is 40% or more and 99% or less. In this specification, the area of the effective region refers to an area obtained by subtracting the total area of a contacting region at which the magnetosensitive portion 20 and the electrode portions 31-34 are in contact from the area of the magnetosensitive portion 20, in plan view.

Comparative Example 1

Figure 3:
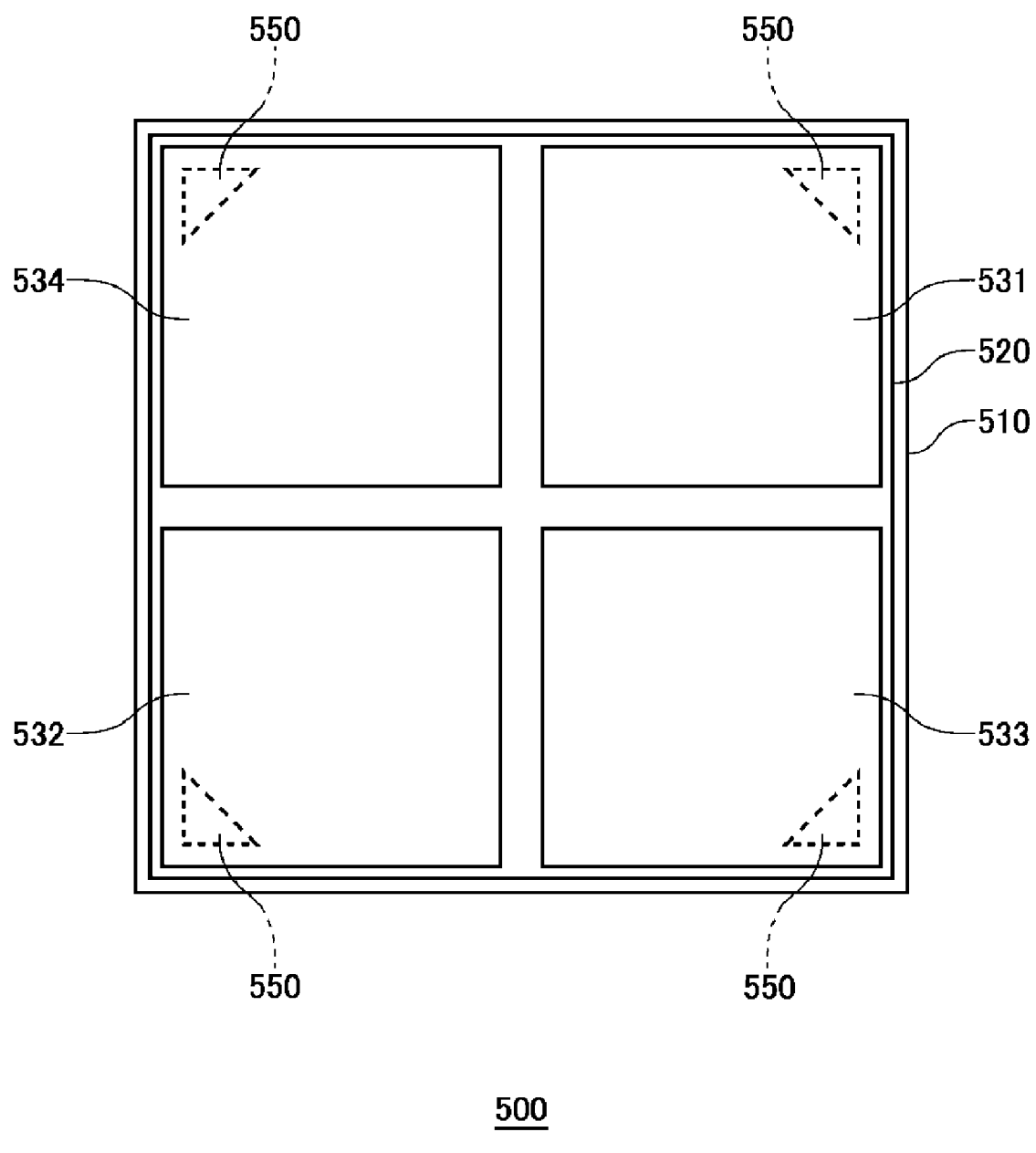
FIG. 3 shows the configuration of a Hall element 500 according to a comparative example 1.

FIG. 3 shows the configuration of a Hall element 500 according to a comparative example 1. The Hall element 500 in the present example includes a substrate 510, a magnetosensitive portion 520, electrode portions 531-534 and contacts 550. The basic configurations are similar to those of the Hall element 100 according to the example embodiment 1. However, it is different from the magnetosensitive portion 20 and the contacts 50 according to the example embodiment 1 in that corner portions of the planar shapes of the magnetosensitive portion 520 and the contacts 550 are not rounded. Note that, although an insulating film is provided between the magnetosensitive portion 520 and the electrode portions 531-534, it is omitted in the present example.

The magnetosensitive portion 520 has a rectangular planar shape. Unlike the magnetosensitive portion 20, corner portions of the rectangle of the magnetosensitive portion 520 are not rounded. Therefore, current concentration occurs at the corner portions of the magnetosensitive portion 520. In particular, if the electrode portion 531 and the electrode portion 532 are input contacts, current concentration is likely to occur at corner portions of the magnetosensitive portion 520 that are connected to the electrode portion 531 and the electrode portion 532, in particular.

The contacts 550 have a triangular planar shape. Unlike the contacts 50, corner portions of the planar shape of the contacts 550 are not rounded. Therefore, current concentration occurs at the corner portions of the contacts 550. In particular, current concentration is likely to occur at corner portions of the contacts 550 that are connected to the electrode portion 531 and the electrode portion 532.

Here, current is input between a contact 550 for the input electrode portion 531 and a contact 550 for the input electrode portion 532 through the magnetosensitive portion 520. However, currents supposed to flow between the electrode portion 531 and the electrode portion 532 may sneak into a part of the magnetosensitive portion 520 at the outer perimeter of a contact 550 for the output electrode portion 533 and the outer perimeter of a contact 550 for the output electrode portion 534. In particular, according to the Hall element 500 in the present example, the shortest distance between the outer perimeter of the magnetosensitive portion 520 and each contact 550 is greater than that in the example embodiment 1. That is, the amount of current flowing at a part of the magnetosensitive portion 520 at the outer perimeter of each contact 550 is greater than that in the Hall element 100 according to the example embodiment 1.

Thus, if the amount of current flowing at the outer perimeter of the electrode portion 533 and the electrode portion 534 for output contact is increased, an error may occur in the Hall electromotive force detected by the electrode portion 533 and the electrode portion 534. Also, a negative sensitivity characteristic may appear in the output of the Hall element 500.

In contrast, according to the example embodiment 1, the magnetosensitive portion 20 and the contacts 50 are designed not to allow currents to flow in a part of the magnetosensitive portion 20 at the outer perimeter of each contact 50. In an example, the planar shapes of the contacts 50 and the magnetosensitive portion 20 are determined such that the shortest distance between each contact 50 and the outer perimeter of the magnetosensitive portion 20 is shorter. For example, the shortest distance between each contact 50 and the outer perimeter of the magnetosensitive portion 20 is 0.5 μm or more and 20 μm or less. As the distance between each contact 50 and the magnetosensitive portion 20 is 0.5 μm or more, the effect of characteristic variation due to misalignment of the contacts 50 is suppressed. As the distance between each contact 50 and the magnetosensitive portion 20 is 20 μm or less, the Hall element 100 becomes unlikely to exhibit a negative sensitivity characteristic, and error in the Hall electromotive force can be reduced. Additionally, in view of ease of fabrication, the distance is preferably 1 μm or more and 15 μm or less, and more preferably 3 μm or more and 10 μm or less. As the contacts 50 are smaller, the current density increases and a greater amount of current flows at a part of the magnetosensitive portion 20 at the outer perimeter of the contacts 50, and therefore this effect becomes significant. For example, the area of each contact 50 is 0.1% or more and 20% or less relative to the area of the magnetosensitive portion 20. Note that the above-described area ratio can be measured by observing the Hall element 100 in top view by an optical microscope. As the area of each contact 50 is 0.1% or more relative to the area of the magnetosensitive portion 20, the effect of characteristic variation due to variation in the contact resistance of the contacts 50 is suppressed. As the area of each contact 50 is 20% or less of the area of the magnetosensitive portion 20, the Hall element 100 becomes unlikely to exhibit a negative sensitivity characteristic, and error in the Hall electromotive force can be reduced. Additionally, in view of ease of fabrication, the area is preferably 0.3% or more and 15% or less, and more preferably 0.5% or more and 10% or less.

Note that the planar shape of the contacts 50 may be such that input contacts and output contacts are arranged differently. The planar shape of output contacts 50 is formed to have a structure which can block currents at the outer perimeter of the contacts 50, but the planar shape of input contacts 50 may not be formed to have a structure which can block currents at the outer perimeter of the contacts 50. For example, they may be arranged such that the distance between each of a plurality of output contacts and the outer perimeter of the magnetosensitive portion 20 is shorter than the distance between each of a plurality of input contacts and the outer perimeter of the magnetosensitive portion 20.

Example Embodiment 2

Figure 4:
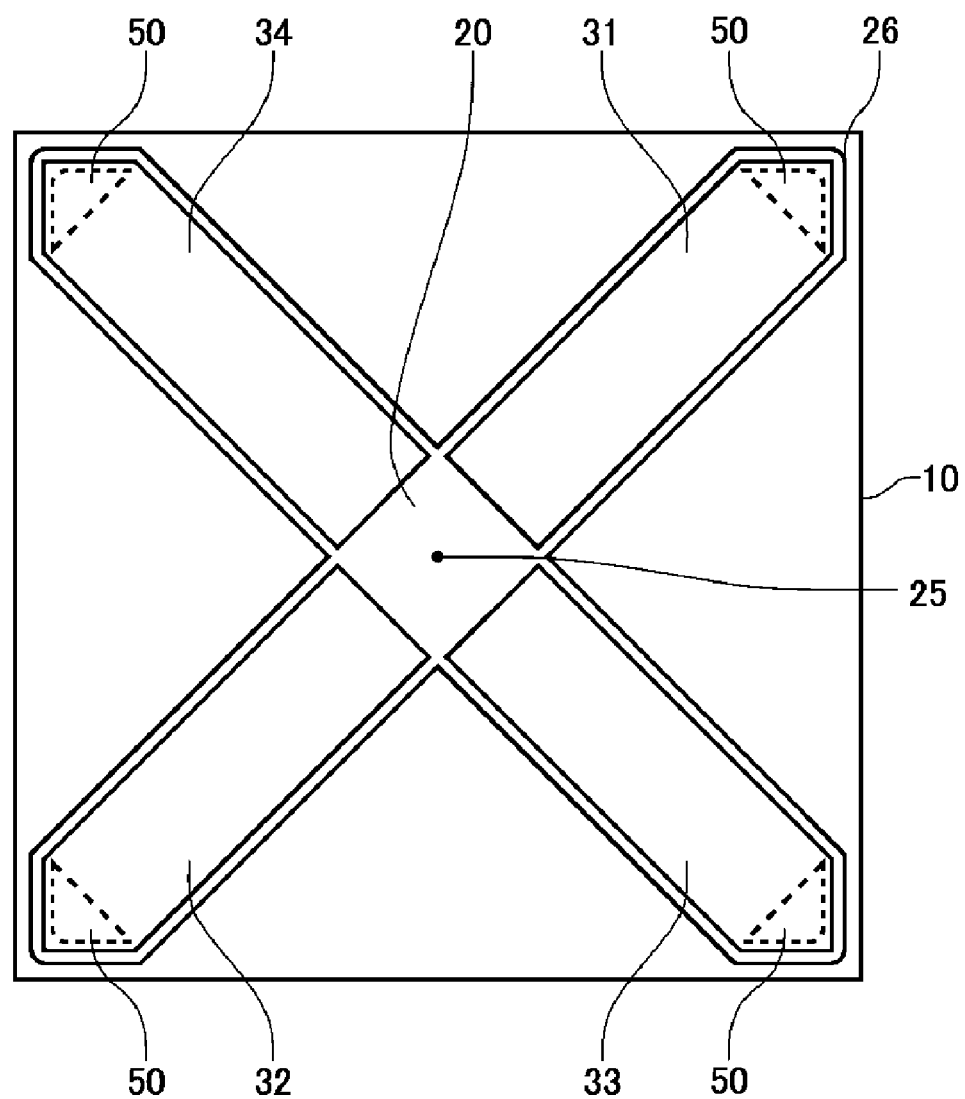
FIG. 4 shows an example of the configuration of the Hall element 100 according to an example embodiment 2.

FIG. 4 shows an example of the configuration of the Hall element 100 according to an example embodiment 2. The planar shape of the magnetosensitive portion 20 in the present example is a cross shape. According to the Hall element 100 in the present example, configurations with the same reference numerals as in the Hall element 100 according to the example embodiment 1 function in a similar manner to those in the example embodiment 1. The present example describes differences from the example embodiment 1, in particular.

The magnetosensitive portion 20 has a cross planar shape. At least one corner of the planar shape of the magnetosensitive portion 20 is rounded. This mitigates current concentration at the end of the magnetosensitive portion 20. The magnetosensitive portion 20 in the present example does not have bulges in directions from the center 25 toward the ends. For example, reference to not having bulges in directions from the center 25 toward the ends means that the magnetosensitive portion 20 does not have a structure which bulges toward output contacts 50 between input contacts 50. In other words, the magnetosensitive portion 20 does not have a region having a width that increases in directions from the center 25 toward the tips of the extending portions. In this manner, reduction of the sensitivity of the Hall element 100 can be prevented. It is considered that this is because sneak currents into a part of the magnetosensitive portion 20 at the outer perimeter of the output contacts 50 can be suppressed.

Example Embodiment 3

Figure 5:
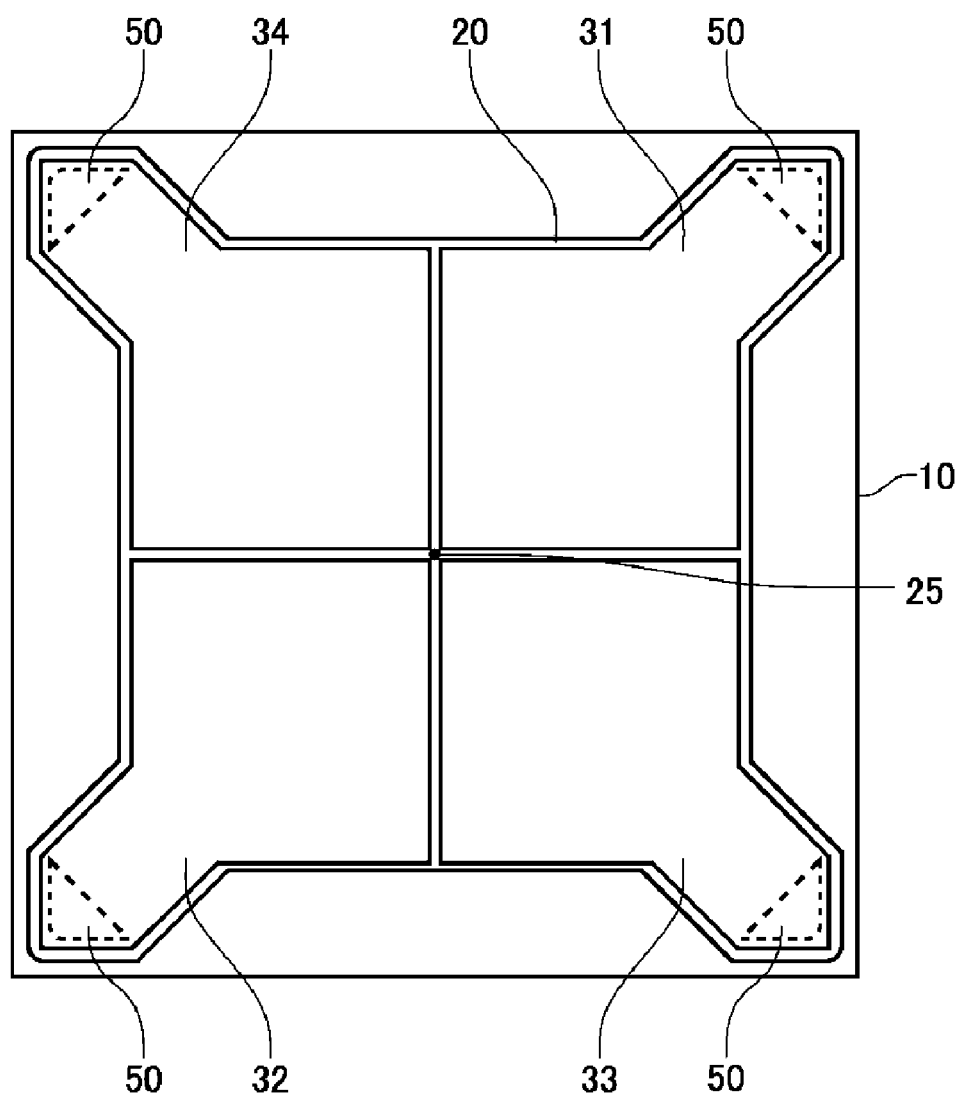
FIG. 5 shows an example of the configuration of the Hall element 100 according to an example embodiment 3.

FIG. 5 shows an example of the configuration of the Hall element 100 according to an example embodiment 3. The magnetosensitive portion 20 in the present example has a planar shape in which a cross shape and a rectangle are overlapped. The magnetosensitive portion 20 has a planar shape in which at least one corner is rounded. The planar shape of the contact 50 has a rounded part at an outer region positioned closer to the outer perimeter of the magnetosensitive portion 20. The magnetosensitive portion 20 in the present example does not have bulges in directions from the center 25 toward the ends. In this manner, the Hall element 100 in the present example suppresses sneak currents into a part of the magnetosensitive portion 20 at the outer perimeter of output contacts 50. Accordingly, the Hall element 100 in the present example can reduce variation in the output.

Comparative Example 2

Figure 6A:
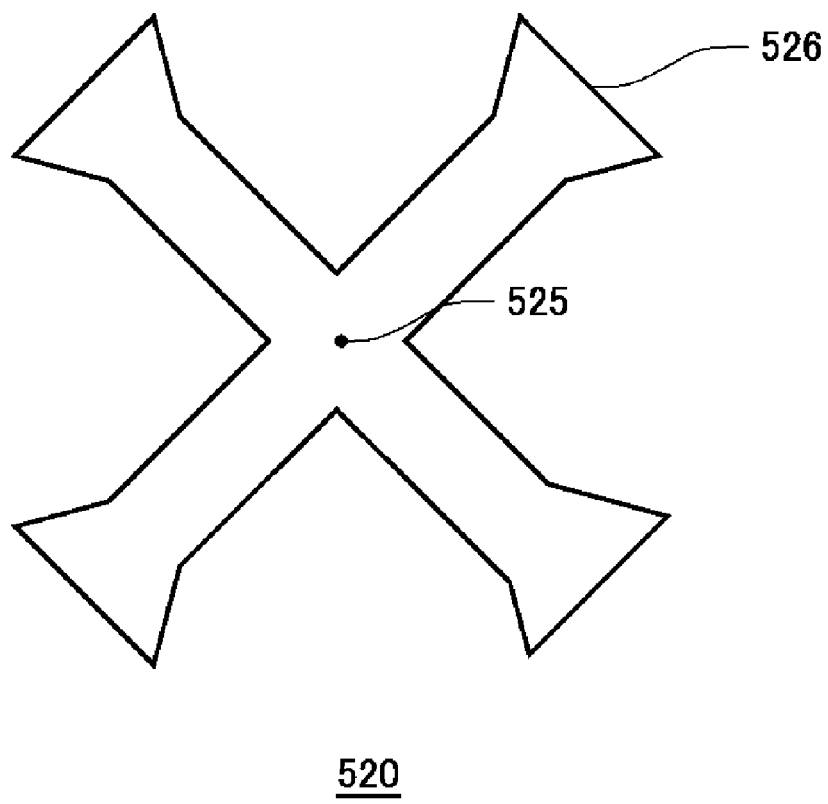
FIG. 6A is a schematic view for illustrating the planar shape of a magnetosensitive portion 520 according to a comparative example 2.
Figure 6B:
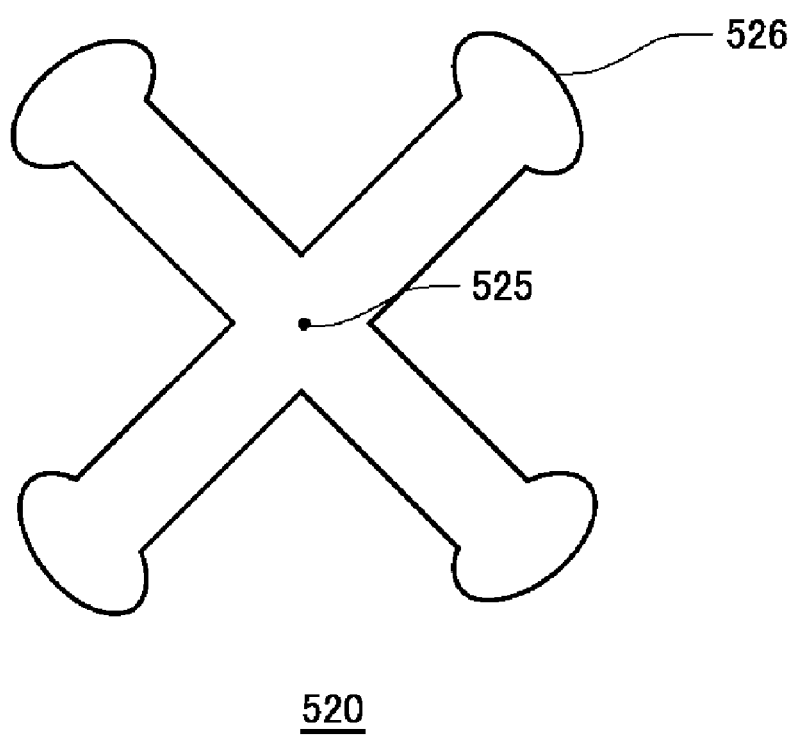
FIG. 6B is a schematic view for illustrating the planar shape of the magnetosensitive portion 520 according to the comparative example 2.

FIG. 6A and FIG. 6B are schematic views for illustrating the planar shape of the magnetosensitive portion 520 according to a comparative example 2. For the sake of brevity, configurations other than the magnetosensitive portion 520 are omitted.

The magnetosensitive portion 520 in the present example is different from the magnetosensitive portion 20 in that it has bulges. The magnetosensitive portion 520 in the present example does not have bulges in directions from a center 525 of the magnetosensitive portion 520 toward tips 526 of the magnetosensitive portion 520. If the magnetosensitive portion 520 has bulges, the outer perimeter length of the magnetosensitive portion 520 is increased, and the exposed area of the side surfaces of the magnetosensitive portion 520 is increased. Here, the exposed area of planes other than a plane having the smallest number of dangling bonds ((100) plane, for example) at the side surfaces of the magnetosensitive portion 520 is increased, and the surface recombination of carriers is facilitated. This may cause fluctuation in the output voltage of the Hall element 500.

Figure 7A:
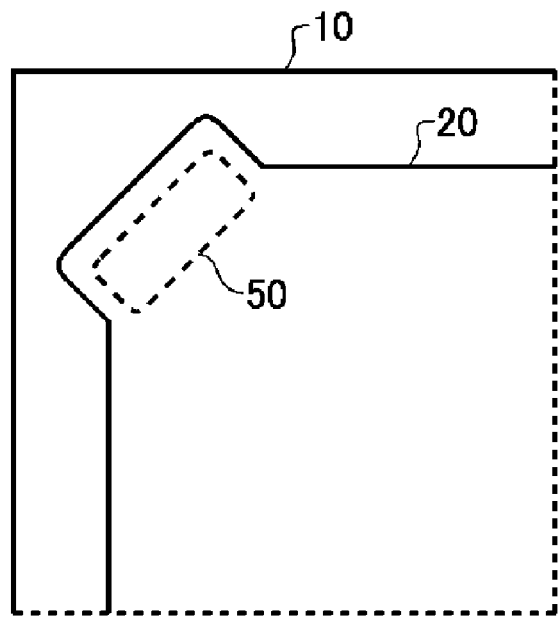
FIG. 7A shows an example of an enlarged view of a magnetosensitive portion 20 and a contact 50.
Figure 7B:
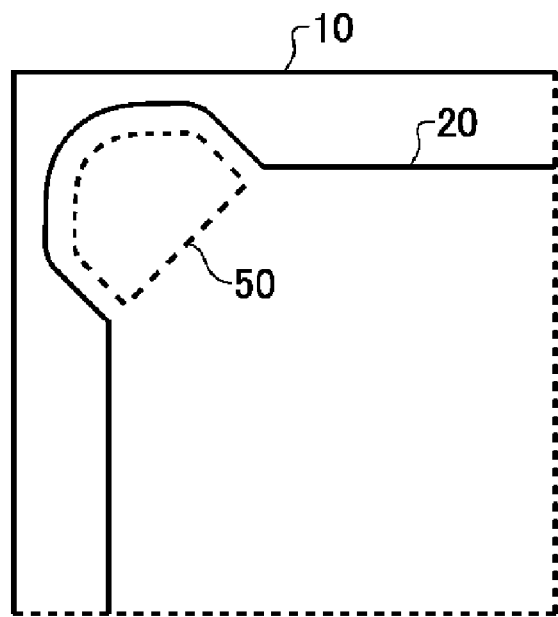
FIG. 7B shows an example of an enlarged view of the magnetosensitive portion 20 and a contact 50.

FIG. 7A and FIG. 7B show examples of an enlarged view of the magnetosensitive portion 20 and a contact 50. For the sake of brevity, the electrode portions 31-34 and the insulating film 40 are omitted.

In FIG. 7A, the magnetosensitive portion 20 and the contact 50 have planar shapes corresponding to each other. Reference to the planar shapes corresponding to each other means that the outer perimeters of the magnetosensitive portion 20 and the contact 50 are close to each other so as not to generate sneak currents into the outer perimeter of the contact 50.

The magnetosensitive portion 20 has a rectangular planar shape. However, the magnetosensitive portion 20 in the present example has a structure that mitigates current concentration at its corner portion. At the corner portion of the magnetosensitive portion 20 in the present example, a rounded rectangular region is formed. In this specification, the case where a structure that mitigates current concentration is provided at corner portions of the rectangle is also included as an example of the case where corner portions of the rectangle of the magnetosensitive portion 20 are rounded. That is, a plurality of rounded parts may be provided at one corner portion of the rectangle of the magnetosensitive portion 20. In the present example, one corner portion of the magnetosensitive portion 20 has two rounded parts.

The contact 50 has a shape corresponding to the shape of the magnetosensitive portion 20. The planar shape of the contact 50 in the present example is, at an outer region positioned closer to the outer perimeter of the magnetosensitive portion 20, similar to the shape of the magnetosensitive portion 20. For example, the planar shape of the contact 50 is a rectangle that is rounded along a rectangular region provided at a corner portion of the magnetosensitive portion 20. This makes it easy to shorten the distance between the outer perimeter of the magnetosensitive portion 20 and the contact 50. In addition, the path of sneak currents into the outer perimeter of the magnetosensitive portion 20 can be blocked. Also, by forming the planar shapes of the magnetosensitive portion 20 and the contact 50 to be similar, the distance between the outer perimeters of the magnetosensitive portion 20 and the contact 50 can be made uniform. In this manner, the amount of current at the end of the magnetosensitive portion 20 can be made uniform to further mitigate current concentration.

In FIG. 7B, the magnetosensitive portion 20 and the contact 50 have planar shapes corresponding to each other. The planar shape of the magnetosensitive portion 20 in the present example is rectangular, and a structure that mitigates current concentration is provided at its end. A protruding region is provided at the corner portion of the magnetosensitive portion 20. The protruding region is rounded so as to mitigate current concentration. Since the planar shapes of the outer regions of the magnetosensitive portion 20 and the contact 50 are similar, the path of sneak currents into the outer perimeter of the magnetosensitive portion 20 can be blocked. Note that the contact 50 in the present example has corner portions at an inner region of its planar shape, and the corner portions of the inner region may also be rounded.

FIG. 8A to FIG. 8D show examples of the planar shape of a contact 50. The magnetosensitive portion 20 in the present example has a planar shape of a rectangle whose corner portions are rounded. For the sake of brevity, the electrode portions 31-34 and the insulating film 40 are omitted.

Figure 8A:
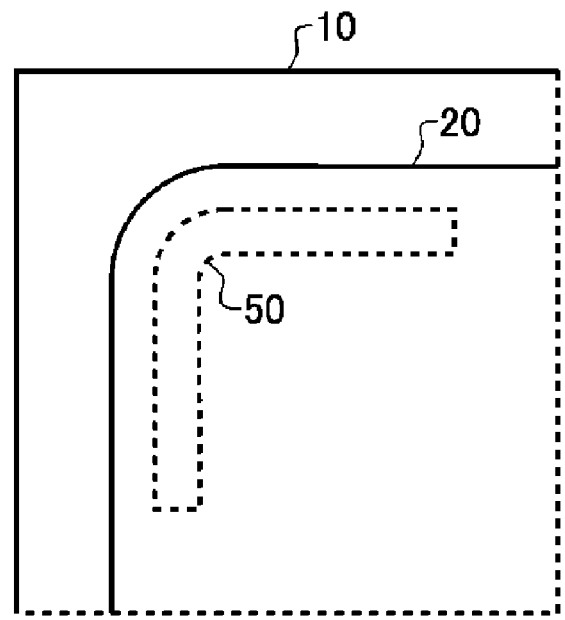
FIG. 8A shows an example of the planar shape of a contact 50.

In FIG. 8A, the contact 50 has an L-shaped planar shape. The contact 50 is formed such that the L-shape is along a corner of the magnetosensitive portion 20. The planar shape of the contact 50 has a rounded part at an outer region positioned closer to the corner portion of the magnetosensitive portion 20. In the present example, an inner region of the contact 50 is also formed to have a rounded part.

Figure 8B:
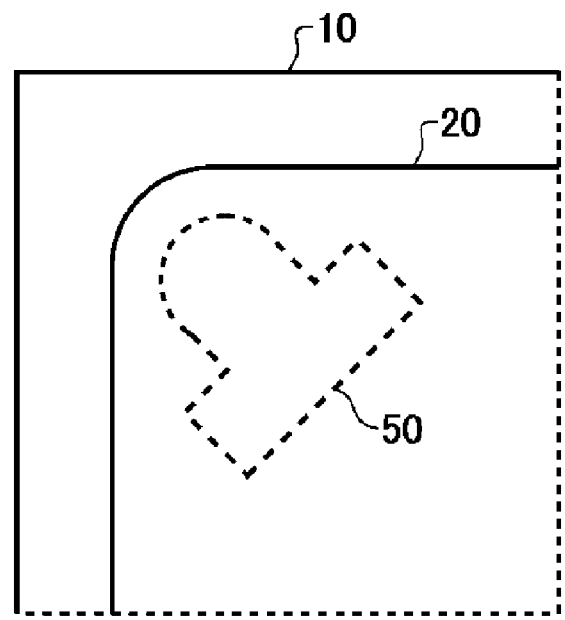
FIG. 8B shows an example of the planar shape of a contact 50.

In FIG. 8B, the contact 50 has a T-shaped planar shape. The contact 50 is formed such that a protruding portion of the T-shape is directed toward a corner of the magnetosensitive portion 20. The protruding portion of the T-shape is rounded along the corner portion of the magnetosensitive portion 20. The planar shapes of the magnetosensitive portion 20 and the contact 50 in the present example are not similar. However, the magnetosensitive portion 20 may have, at its outer region, a planar shape that is similar to that of the contact 50.

Figure 8C:
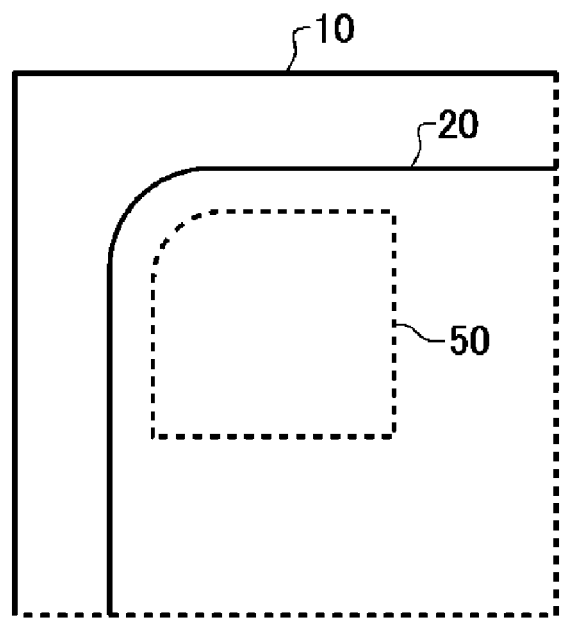
FIG. 8C shows an example of the planar shape of the contact 50.

In FIG. 8C, the contact 50 has a rectangular planar shape. The contact 50 is formed such that a corner portion of the rectangle is directed toward a corner portion of the magnetosensitive portion 20. The corner portion of the contact 50 is rounded along the corner portion of the magnetosensitive portion 20. The contact 50 in the present example has, at its outer region, a planar shape that is similar to that of the magnetosensitive portion 20.

Figure 8D:
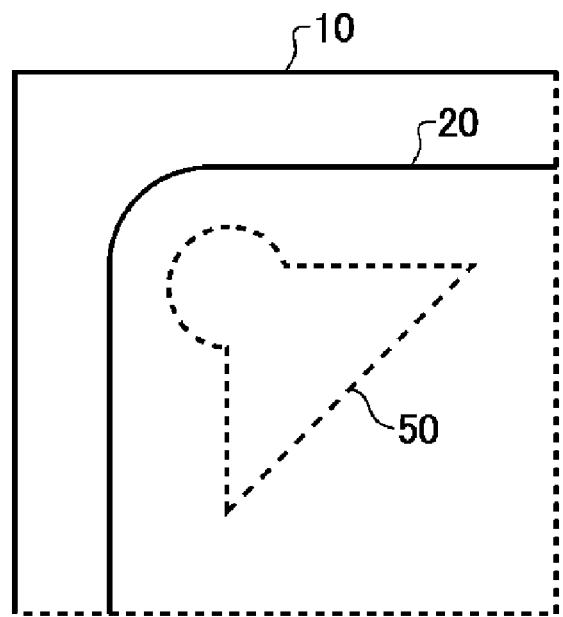
FIG. 8D shows an example of the planar shape of a contact 50.

In FIG. 8D, the contact 50 has a triangular planar shape. The contact 50 is formed such that a corner portion of the triangle is directed toward a corner portion of the magnetosensitive portion 20. The corner portion of the triangle is rounded along the corner portion of the magnetosensitive portion 20. The contact 50 in the present example has a planar shape in which a triangle and a circle are overlapped. The planar shapes of the magnetosensitive portion 20 and the contact 50 in the present example are not similar. However, the magnetosensitive portion 20 may have, at its outer region, a planar shape that is similar to that of the contact 50.

FIG. 9A to FIG. 9F show an example of a fabrication method of the Hall element 100. The fabrication method of the Hall element 100 in the present example is an example and not so limited.

Figure 9A:
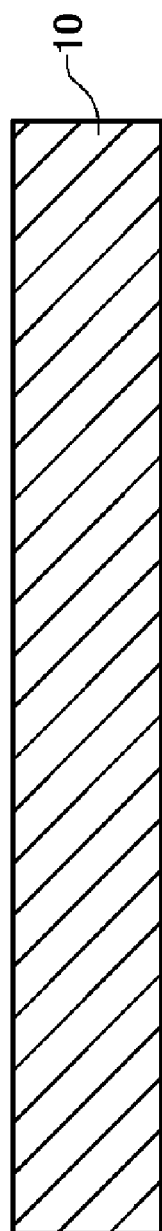
FIG. 9A shows an example of a fabrication method of the Hall element 100.
Figure 9B:
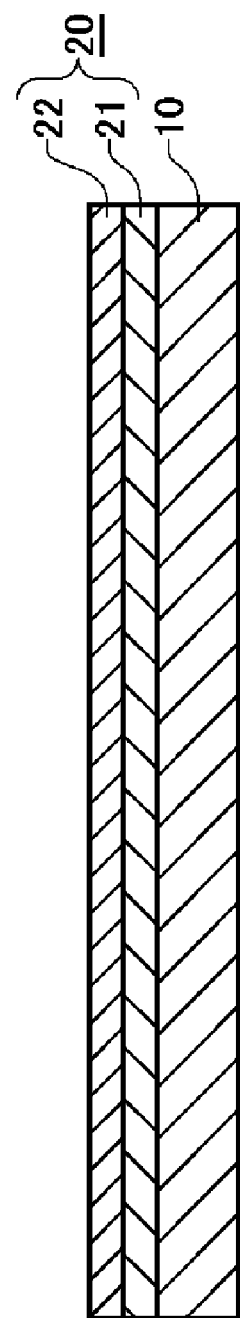
FIG. 9B shows an example of the fabrication method of the Hall element 100.

In FIG. 9A, a substrate 10 is provided. The planar shape of the substrate 10 in the present example is rectangular. In FIG. 9B, a magnetosensitive portion 20 is formed on the substrate 10. In the present example, a conductive layer 21 is formed on the substrate 10, and a surface layer 22 is formed on the conductive layer 21. In the step of film formation of the magnetosensitive portion 20, the planar shapes of the conductive layer 21 and the surface layer 22 may be the same as the planar shape of the substrate 10. For example, the magnetosensitive portion 20 is formed by epitaxially growing a compound semiconductor on the substrate 10 using MOCVD (Metal Organic Chemical Vapor Deposition) or MBE (Molecular Beam Epitaxy).

Figure 9C:
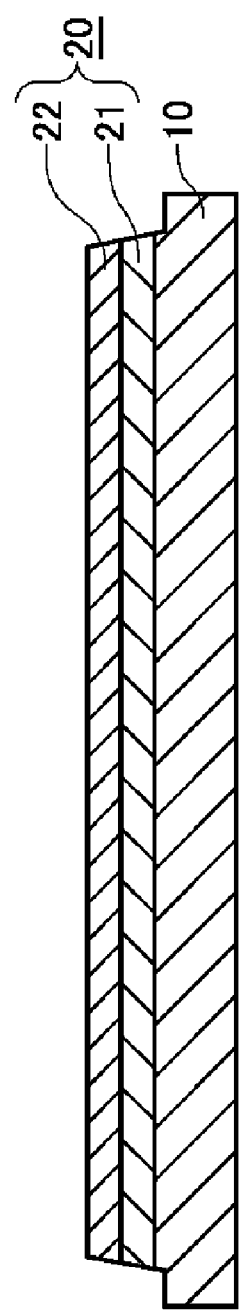
FIG. 9C shows an example of the fabrication method of the Hall element 100.
Figure 9D:
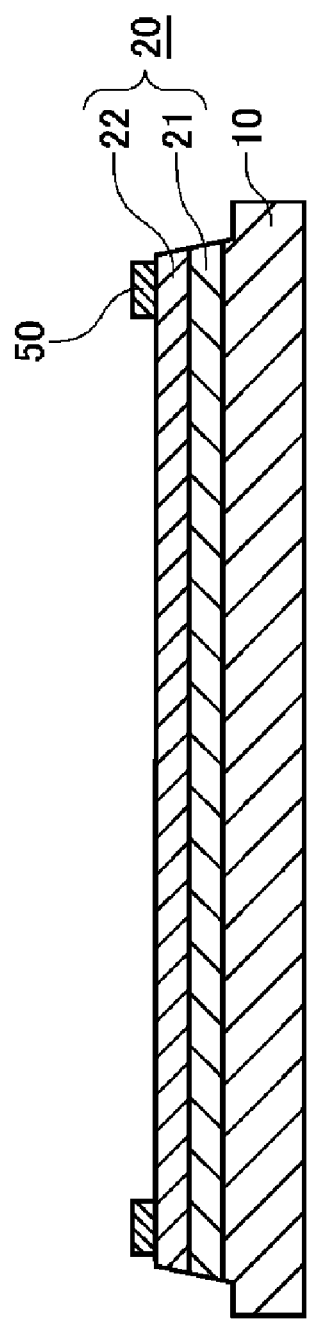
FIG. 9D shows an example of the fabrication method of the Hall element 100.

In FIG. 9C, the magnetosensitive portion 20 is etched into a pattern of a predetermined planar shape. In this manner, the planar shape of the magnetosensitive portion 20 is formed to be rectangular, cross-shaped or the like. Corner portions of the planar shape of the magnetosensitive portion 20 may be rounded in the etching process. In FIG. 9D, contacts 50 are formed on the magnetosensitive portion 20. The contacts 50 are formed using any semiconductor fabrication process such as vapor deposition or sputtering.

Figure 9E:
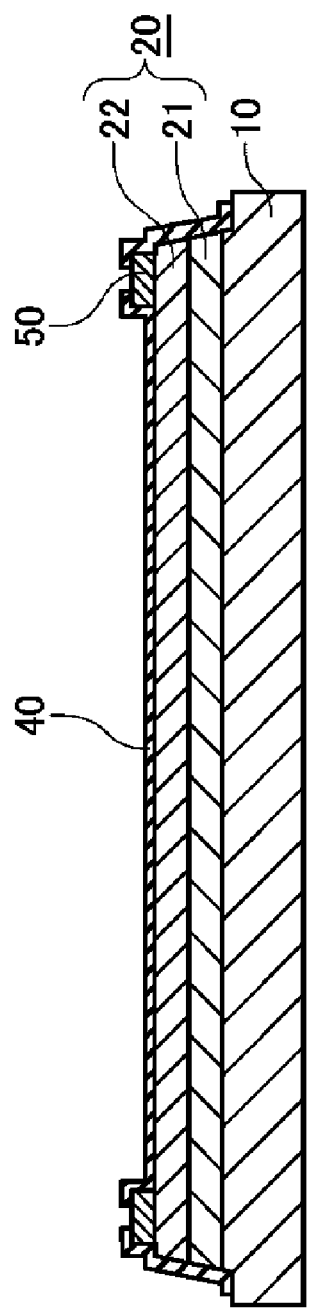
FIG. 9E shows an example of the fabrication method of the Hall element 100.
Figure 9F:
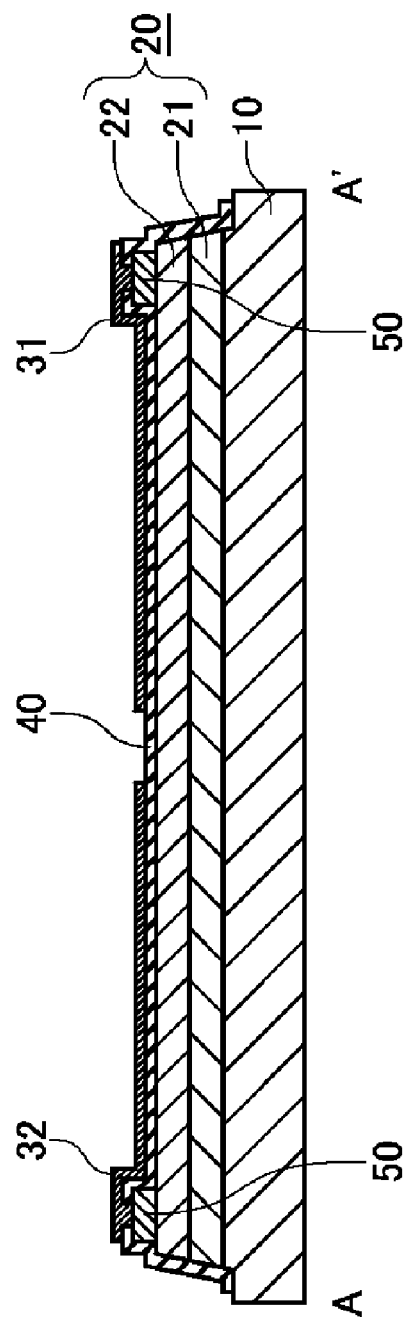
FIG. 9F shows an example of the fabrication method of the Hall element 100.

In FIG. 9E, an insulating film 40 is formed on the substrate 10, the magnetosensitive portion 20 and the contacts 50. In an example, a SiN film having a thickness of 300 nm is formed as the insulating film 40. Openings for electrically connecting the contacts 50 and the electrode portions 31-34 are formed in the insulating film 40. The openings may be formed by an etching process. In FIG. 9F, electrode portions 31-34 are formed on the insulating film 40. The electrode portions 31-34 are electrically connected to the contacts 50 through the openings formed in the insulating film 40. In an example, the thickness of each of the electrode portions 31-34 is 0.5 μm, but is not so limited. The electrode portions 31-34 may be connected to external electrodes by bonding wires 251-254. Ball portions such as a gold ball may be provided on the electrode portions 31-34.

Note that, according to the fabrication method of the Hall element 100 in the present example, the step of forming the contacts 50 is performed prior to the step of forming the insulating film 40. However, the step of forming the contacts 50 may be performed after the step of forming the insulating film 40.

Example Embodiment 3

Figure 10A:
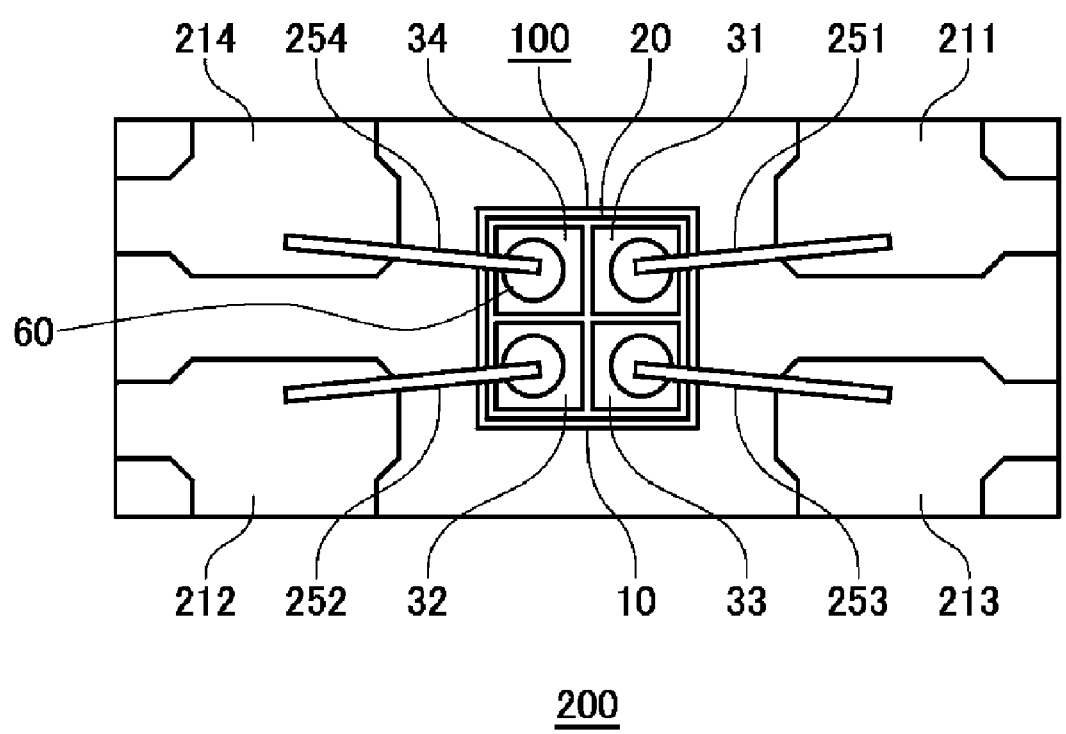
FIG. 10A shows an example of a plan view of the Hall sensor 200.
Figure 10B:
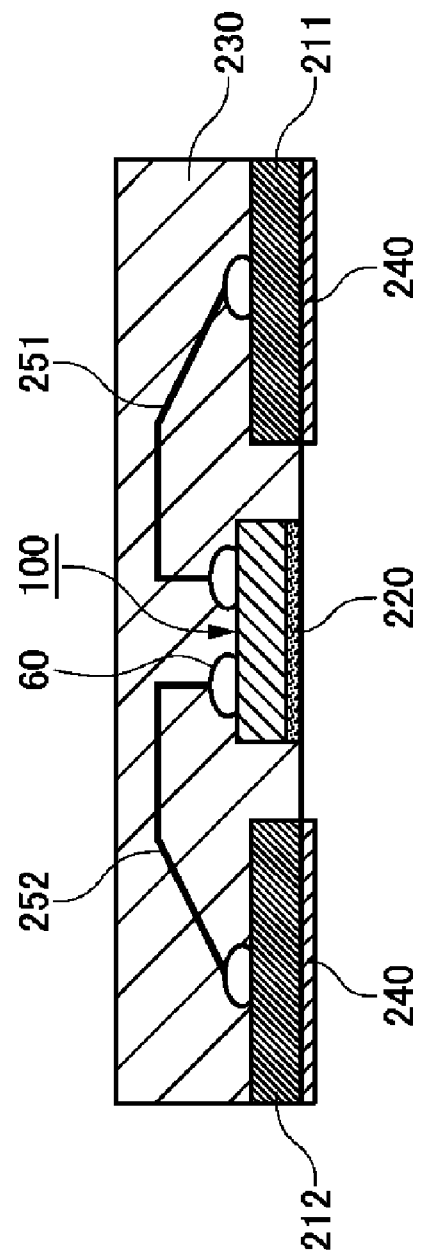
FIG. 10B is an example of a cross-sectional view of the Hall sensor 200.

FIG. 10A and FIG. 10B show an example of the configuration of the Hall element 100 according to an example embodiment 3. The Hall element 100 in the present example further includes ball portions 60.

The ball portions 60 are provided between the electrode portions 31-34 and the respective bonding wires 251-254. The ball portions 60 are formed of a conductive material. The ball portions 60 may be formed of the same material as that of the bonding wires 251-254. The ball portions 60 in the present example are gold balls. In an example, each ball portion 60 has a diameter of 10 μm or more and 100 μm or less in plan view. Note that, if a ball portion is not perfectly circular in top view, the ball portion is approximated as an oval having the same area as the ball portion in top view, and the length of the major axis of the oval is regarded as the diameter. Each ball portion 60 in the present example has a diameter of 60 μm. The thickness of each ball portion 60 is preferably 5 μm or more. Note that the thickness of a ball portion 60 refers to the distance between the highest portion of the ball portion 60 and one of the electrode portions 31-34 on which the ball portion 60 is arranged.

Here, when observing a cross-sectional transparent view obtained by X-ray radiography of the Hall sensor 200 and tracing through a bonding wire 252 from the lead terminal 212 side to the Hall element 100 side, a portion having a greater width than the thickness of the bonding wire may be defined as a ball portion 60.

In plan view, the projection area of the ball portions 60 accounts for 10% or more of the projection area of the magnetosensitive portion 20. In an example, the projection area of the ball portions 60 may be 15% or more, 20% or more or 30% or more of the projection area of the magnetosensitive portion 20. Here, the projection area of the ball portions 60 refers to the sum of the projection areas of all the ball portions 60 present on the magnetosensitive portion 20. The ball portions 60 block light incident to the magnetosensitive portion 20 by absorbing or reflecting light. In this manner, the local conductivity variation caused by light incident to the magnetosensitive portion 20 can be suppressed. In particular, if the thickness of the Hall element 100 is reduced, variation in the local conductivity becomes likely to occur due to the photoelectric effect at the magnetosensitive portion 20. Accordingly, variation in the offset voltage is suppressed. Thus, in view of blocking light, it is preferable to increase the ratio of the projection area of the ball portions 60 relative to the projection area of the magnetosensitive portion 20. It is further preferable that the above-described ball portions are provided on all the electrode portions 31-34 of the Hall element 100. It is further preferable that, when observing a cross section passing through the center 25 of the magnetosensitive portion 20 in plan view and the center of a portion at which the electrode portion 32 is in contact with the magnetosensitive portion 20, at least one of the ball portions 60 is provided closer to the center 25 of the magnetosensitive portion 20 than the center of the portion at which the electrode portion 32 is in contact with the magnetosensitive portion 20. Each ball portion 60 may also be provided between a plurality of input contacts in plan view. Note that, if the material of the ball portions 60 is gold, the gold material reflects light having a wavelength within the infrared range or more, and it is therefore possible to prevent light having a wavelength within the infrared range from being incident to the magnetosensitive portion 20. The material of the ball portions 60 is not particularly limited by the the present example as long as it absorbs or reflects light having a predetermined wavelength in order to prevent light from being incident to the magnetosensitive portion 20. In view of blocking light, it is preferable that each ball portion 60 has a greater thickness, which is 5 µm or more and 100 µm or less, for example. Additionally, in view of ease of fabrication, the thickness is preferably 10 µm or more and 80 µm or less, and more preferably 20 µm or more and 60 µm or less.

Figure 11:
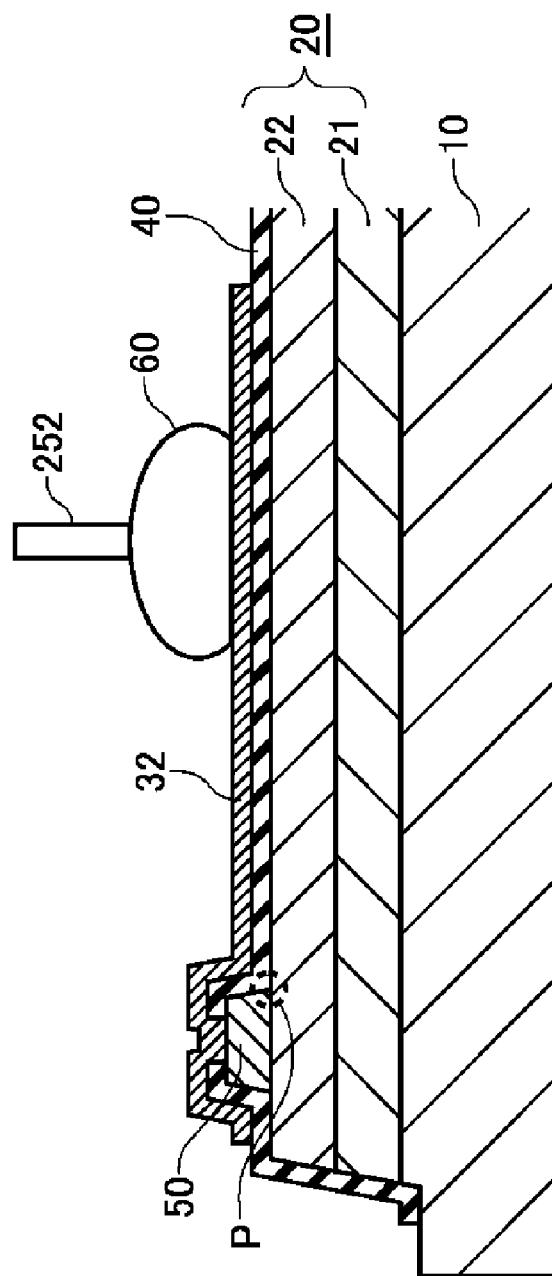
FIG. 11 shows an example of an enlarged view of the Hall element 100 having ball portions 60.

FIG. 11 shows an example of an enlarged view of the Hall element 100 having ball portions 60. The figure shows a cross-sectional view of the Hall element 100. The cross-sectional view in the present example shows a cross section including the center 25 of the magnetosensitive portion 20 and the center of a region at which the electrode portion 32 is in contact with the magnetosensitive portion 20. Note that, although the present example embodiment is shown such that the magnetosensitive portion 20, the insulating film 40, the electrode portions 31-34 and the ball portions 60 are formed, another layer may be included between layers or on each layer.

The ball portions 60 are provided between the bonding wires and the electrode portions. Although the ball portions 60 are provided between the bonding wires 252 and the electrode portions 32 in the present example, they are also provided between other bonding wires and electrode portions. The ball portions 60 in the present example are electrically connected to the electrode portions 31-34, and provided on the magnetosensitive portion 20 in plan view.

The bonding wires 251-254 are electrically connected to the ball portions 60 and extended perpendicularly from the electrode portions 31-34. By extending the bonding wires 251-254 perpendicularly from the electrode portions 31-34, magnetic fields in a direction parallel to the magnetosensitive portion 20 become unlikely to be generated. In this manner, variation in the output of the Hall element 100 is suppressed, and the magnetic sensitivity is improved. In an example, the bonding wires 251-254 are extended perpendicularly from the electrode portions 31-34 by 5% or more of the diameter of each ball portion 60. When the bonding wires 251-254 are extended perpendicularly from the electrode portions 31-34 by a predetermined distance or more, they may be further extended toward the lead terminals 211-214.

The ball portions 60 may also be formed on the contacts 50. As the ball portions 60 are formed on the contacts 50, current components flowing in a direction parallel to the magnetosensitive portion 20 is reduced, and the magnetic sensitivity of the Hall element 100 is improved. When it is referred that the ball portions 60 are formed on the contacts 50, it is not required that all the ball portions 60 are formed on the contacts 50 as long as at least some of the ball portions 60 are formed on the contacts 50.

Note that the bonding wires 251-254 are not required to be completely perpendicular to the electrode portions 31-34, and may be inclined to such an extent that magnetic fields are not generated in the magnetosensitive portion 20 to affect the magnetic sensitivity of the Hall element 100. For example, the bonding wires 251-254 may be inclined by 5 degrees or less from a direction perpendicular to the electrode portions 31-34. They may also be inclined by 10 degrees or less, 15 degrees or less or 20 degrees or less from a direction perpendicular to the electrode portions 31-34. By forming the bonding wires to be perpendicular, magnetic fields caused by currents flowing through the bonding wires can be made parallel to the magnetosensitive portion 20. This makes it possible to reduce the effect of the magnetic fields on the magnetosensitive portion 20, and to reduce errors in the output voltage. Note that, the above-described effect is enhanced when the magnetosensitive portion 20 has a rectangular planar shape or when the regions surrounded by the four contacts 50 are entirely included in the magnetosensitive portion 20.

A region P is a region in the vicinity of the boundary between a contact 50 and the magnetosensitive portion 20. The interface between the contact 50 and the magnetosensitive portion 20 is included in the region P. The contact 50 in the present example has a structure that mitigates current concentration at the region P. When observing the contact 50 in a cross section passing through the center 25 of the magnetosensitive portion 20 in plan view and the center of a portion at which the electrode portion 32 is in contact with the magnetosensitive portion 20, at least a part of the contact 50 extends below the insulating film 40 in the cross section. For example, at least a part of a side surface of the contact 50 closer to the center 25 of the magnetosensitive portion 20 is formed at a farther position from the center 25 of the magnetosensitive portion 20 than a point at which the side surface of the contact 50 and the outermost surface of the magnetosensitive portion 20 are in contact. Also, the point at which the side surface of the contact 50 and the outermost surface of the magnetosensitive portion 20 are in contact may extend toward the center 25 of the magnetosensitive portion 20. That is, a side surface of the contact 50 closer to the ball portion 60 may have a cross-sectional shape that is forward-tapered, or its upper end may extend toward the ball portion 60. In this manner, the contact 50 mitigates current concentration at the point at which the side surface of the contact 50 closer to the center 25 and the outermost surface of the magnetosensitive portion 20 are in contact. Accordingly, heat generation at the point at which the side surface of the contact 50 closer to the center 25 and the outermost surface of the magnetosensitive portion 20 are in contact is suppressed, and variation in the characteristics of the Hall element 100 is suppressed. Also, since current concentration in the vicinity of the contact 50 is suppressed, exfoliation of the electrode in the vicinity of the contact 50 becomes unlikely to occur. Accordingly, the reliability of the Hall element 100 is improved. Note that current concentration at the lower end of the contact 50 described above is a problem specific to the Hall element having the electrode portions 31-34 as in the present example embodiment. Thus, the shape of the upper end of the side surface of the contact 50 closer to the center 25 is not particularly limited.

Note that, when observing in the above-described cross section, at least one of the ball portions 60 is provided closer to the center 25 of the magnetosensitive portion 20 than the center of a portion at which the electrode portion 32 is in contact with the magnetosensitive portion 20. Each ball portion 60 may be provided between a plurality of input contacts in plan view. In this case, a current path is formed such that currents flowing between the ball portion 60 and the magnetosensitive portion 20 turn back at the region P. Then, current concentration becomes likely to occur at the region P. Therefore, the effect obtained by forming the contact 50 to have a forward-tapered shape is enhanced.

As described above, the Hall element 100 in the present example is connected perpendicularly to the bonding wires 251-254, and therefore the effect of magnetic fields caused by currents flowing through the bonding wires on the magnetosensitive portion 20 are reduced. Also, the Hall element 100 has a structure that suppresses current concentration in the vicinity of the point at which the side surface of the contact 50 closer to the center 25 and the outermost surface of the magnetosensitive portion 20 are in contact. In this manner, variation in the characteristics of the Hall element 100 is reduced.

Figure 12:
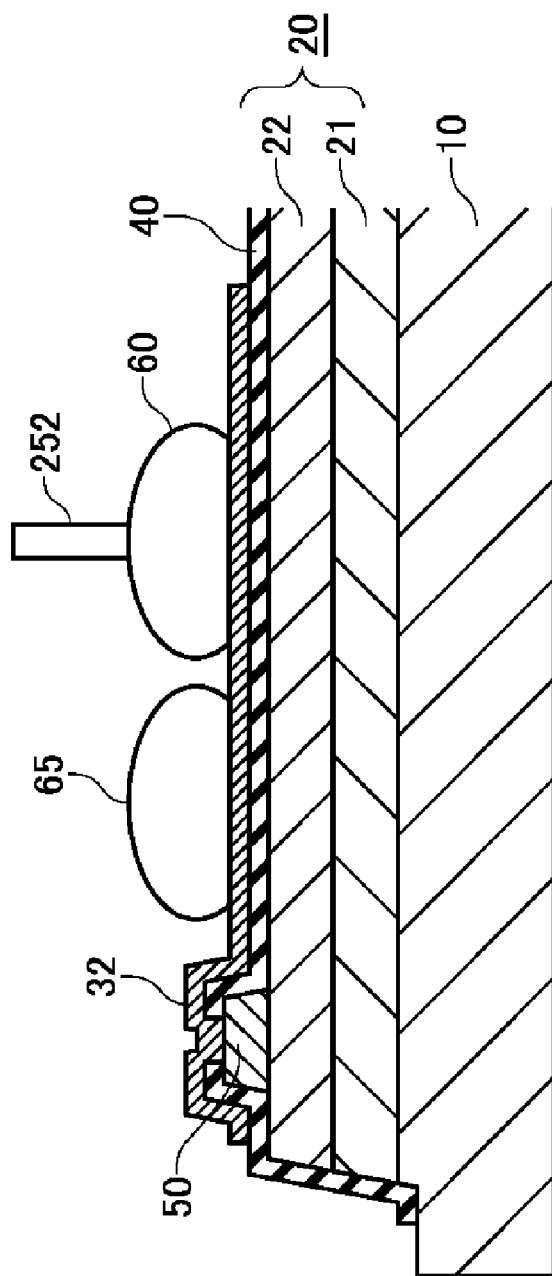
FIG. 12 shows an example of an enlarged view of the Hall element 100 having dummy balls 65.

FIG. 12 shows an example of an enlarged view of the Hall element 100 having dummy balls 65. The figure shows a cross-sectional view of the Hall element 100. The cross-sectional view in the present example shows a cross section including the center 25 of the magnetosensitive portion 20 and the center of a region at which the electrode portion 32 is in contact with the magnetosensitive portion 20. The Hall element 100 in the present example further includes dummy ball 65.

The dummy balls 65 are provided on the electrode portions 31-34. The dummy balls 65 are ball portions that are not connected to the bonding wires. By providing the dummy balls 65, light incident to the magnetosensitive portion 20 can be blocked in a similar manner to the case where the ball portions 60 are provided. In particular, it is preferable to provide the dummy balls 65 when the magnetosensitive portion 20 can not be covered only by the ball portions 60 connected to the bonding wires 251-254.

Figure 13:
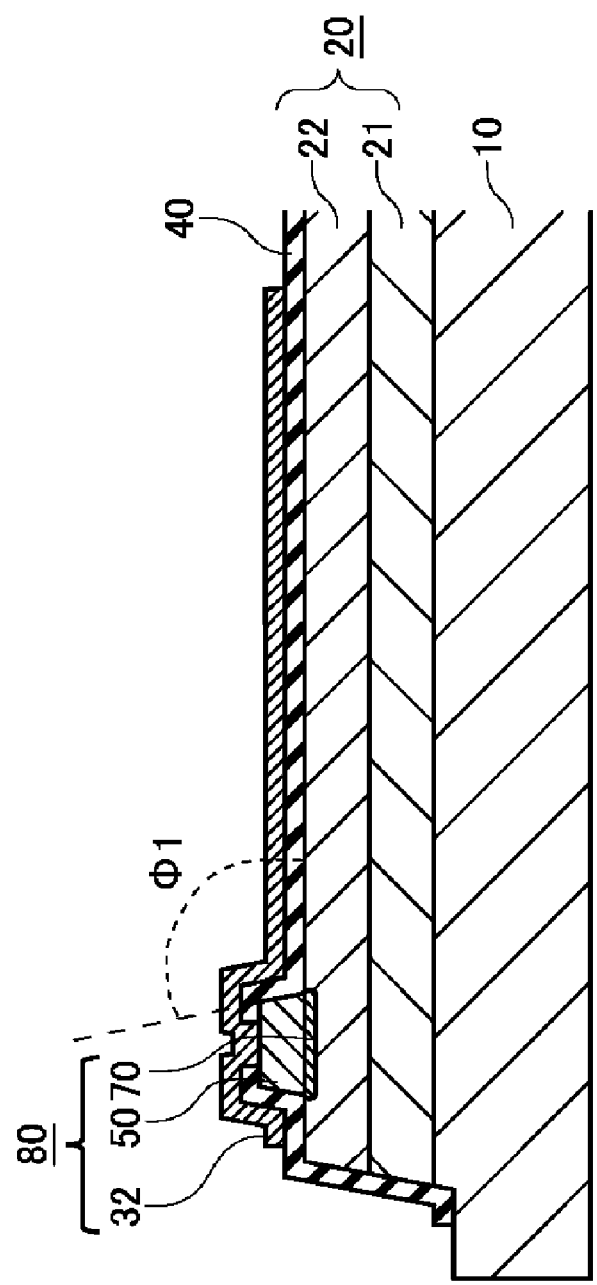
FIG. 13 shows an example of a cross-sectional shape of the Hall element 100.

FIG. 13 shows an example of a cross-sectional shape of the Hall element 100. The cross-sectional view in the present example shows a cross section including the center 25 of the magnetosensitive portion 20 and the center of a region at which the electrode portion 32 is in contact with the magnetosensitive portion 20. The Hall element 100 in the present example includes a conductive portion 80.

The conductive portion 80 includes an electrode portion 32, a contact 50 and a contact 70. At least a part of the conductive portion 80 extends below the insulating film 40 in a cross section including the center 25 of the magnetosensitive portion 20 and the center of a region at which the electrode portion 32 is in contact with the magnetosensitive portion 20. In the present example, the contact 50 and the contact 70 extend below the insulating film 40 in the cross section.

The contact 70 is formed at the interface between the contact 50 and the magnetosensitive portion 20 by annealing. The contact 70 is an alloy portion formed by annealing. The contact 70 is formed in the magnetosensitive portion 20 and below the contact 50. The contact 70 in the present example extends closer to the center 25 of the magnetosensitive portion 20 than the contact 50 in plan view. According to the Hall element 100 in the present example, the contact 50 and the contact 70 extend below the insulating film 40, and therefore current concentration in the vicinity of a point at which a side surface of the contact 50 closer to the center 25 and the outermost surface of the magnetosensitive portion 20 are in contact can be suppressed. As the contact 50 is smaller, the amount of current flowing therethrough increases and therefore this effect becomes significant. For example, the area of the contact 50 is 0.1% or more and 20% or less relative to the area of the magnetosensitive portion 20. As the area of each contact 50 is 0.1% or more relative to the area of the magnetosensitive portion 20, the effect of characteristic variation due to variation in the contact resistance of the contacts 50 is suppressed. When the area of the contact 50 is 20% or less relative to the area of the magnetosensitive portion 20, current concentration in the vicinity of the point at which the side surface of the contact 50 closer to the center 25 and the outermost surface of the magnetosensitive portion 20 are in contact can be suppressed. Additionally, in view of ease of fabrication, the area is preferably 0.3% or more and 15% or less, and more preferably 0.5% or more and 10% or less.

$\varphi 1$ indicates an angle formed by the side surface of the contact 50 closer to the center 25 and the outermost surface of the magnetosensitive portion 20. $\varphi 1$ is preferably an obtuse angle. In this manner, current concentration at the point at which the side surface of the contact 50 closer to the center 25 and the outermost surface of the magnetosensitive portion 20 are in contact is further mitigated. In view of mitigating current concentration at the point at which the side surface of the contact 50 closer to the center 25 and the outermost surface of the magnetosensitive portion 20 are in contact, it is preferable to increase $\varphi 1$. In an example, $\varphi 1$ is greater than 90° and less than 135°.

At least a part of the conductive portion 80 in the present example extends from the point at which the side surface of the contact 50 and the outermost surface of the magnetosensitive portion 20 are in contact toward the center of the magnetosensitive portion 20 or in its depth direction by 50 nm or more. A region of the conductive portion 80 that extends toward the ball portion 60 may be 100 nm or more, 150 mm or more, 200 nm or more or 1 µm or more. Extending in the depth direction of the magnetosensitive portion 20 also makes it possible to mitigate current concentration and to suppress variation in the reliability due to heat generation. The region of the conductive portion 80 that extends toward the ball portion 60 can be formed to have a predetermined shape by forming the contact 50 in advance. Even if the contact 50 is formed after forming the insulating film 40, at least a part of the conductive portion 80 can be diffused toward the ball portion 60 by performing an annealing process. Thus, a region of the conductive portion 80 that extends toward the ball portion 60 may be adjusted to a predetermined size by etching, annealing or the like of the conductive portion 80.

In the present example, the point at which the side surface of the contact 50 closer to the center 25 and the outermost surface of the magnetosensitive portion 20 are in contact is provided, in plan view, closer to the center 25 of the magnetosensitive portion 20 than the upper end of the contact 50. The contact 50 extends from the point at which the side surface of the contact 50 closer to the center 25 of the magnetosensitive portion 20 and the outermost surface of the magnetosensitive portion 20 are in contact toward the center of the magnetosensitive portion 20 or in its depth direction by 100 nm or more. At least a part of the conductive portion 80 may extend from the point at which the side surface of the conductive portion 80 closer to the center 25 and the outermost surface of the magnetosensitive portion 20 are in contact toward the center of the magnetosensitive portion 20 or in its depth direction by an amount of ¼ or more of the thickness of the insulating film 40.

Note that, according to the fabrication method of the Hall element 100 in the present example, film formation of the insulating film 40 on the contact 50 is performed after forming the contact 50. After forming openings in the insulating film 40, the electrode portion 32 is formed on the insulating film 40 to be electrically connected to the contact 50. By forming the contact 50 in advance, the shape of the contact 50 can be formed to have a predetermined value of φ1.

Figure 14:
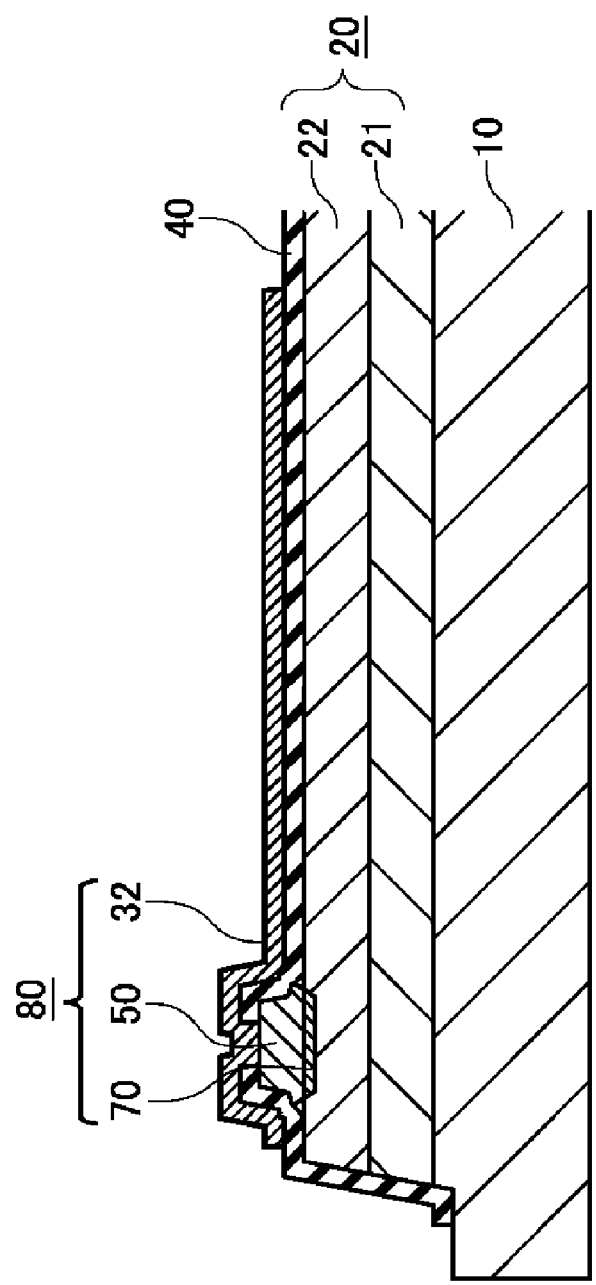
FIG. 14 shows an example of a cross-sectional shape of the Hall element 100.

FIG. 14 shows an example of a cross-sectional shape of the Hall element 100. The cross-sectional view in the present example shows a cross section including the center 25 of the magnetosensitive portion 20 and the center of a region at which the electrode portion 32 is in contact with the magnetosensitive portion 20. The Hall element 100 in the present example includes a conductive portion 80.

The conductive portion 80 includes an electrode portion 32, a contact 50 and a contact 70. At least a part of the conductive portion 80 extends below the insulating film 40 in a cross section including the center 25 of the magnetosensitive portion 20 and the center of a region at which the electrode portion 32 is in contact with the magnetosensitive portion 20. In the present example, the contact 50 and the contact 70 extend below the insulating film 40 in the cross section.

The side surface of the contact 50 closer to the center 25 in the present example has such a structure that it is spaced apart from the outermost surface of the magnetosensitive portion 20. In this manner, the contact 70 is not formed at the interface between the side surface of the contact 50 closer to the center 25 and the magnetosensitive portion 20. Accordingly, the contact 70 in the present example is arranged such that the contact 50 extends closer to the center 25 of the magnetosensitive portion 20 than the contact 70 in plan view. According to the Hall element 100 in the present example, the contact 50 and the contact 70 extend below the insulating film 40, and therefore current concentration in the vicinity of a point at which a side surface of the contact 50 closer to the center 25 and the outermost surface of the magnetosensitive portion 20 are in contact can be suppressed.

Figure 15:
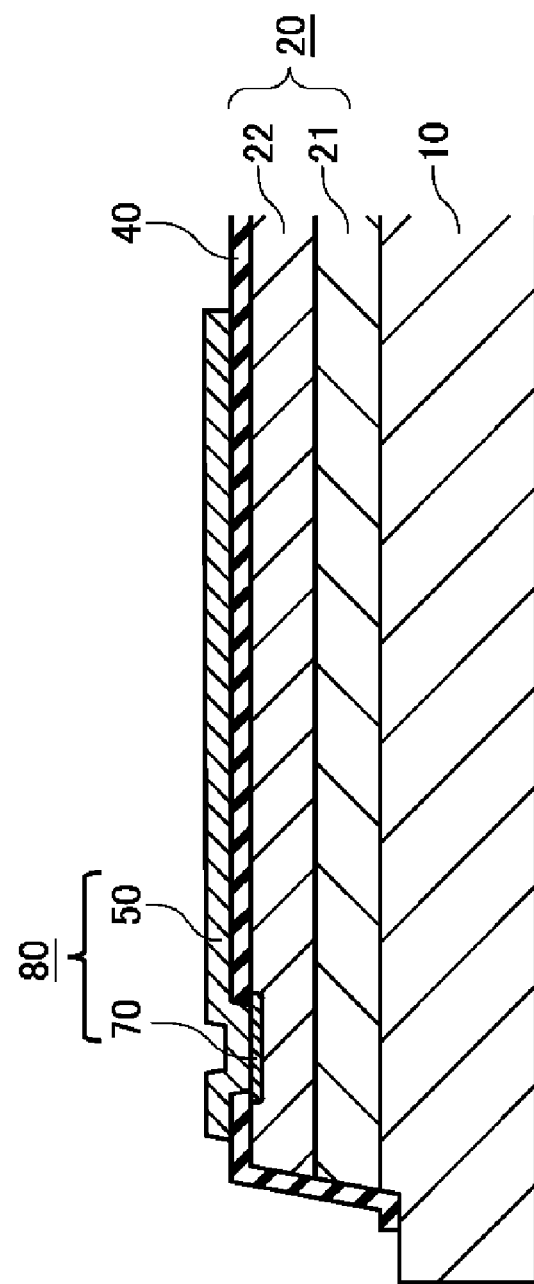
FIG. 15 shows an example of a cross-sectional shape of the Hall element 100.

FIG. 15 shows an example of a cross-sectional shape of the Hall element 100. The cross-sectional view in the present example shows a cross section including the center 25 of the magnetosensitive portion 20 and the center of a region at which the electrode portion 32 is in contact with the magnetosensitive portion 20. The Hall element 100 in the present example includes a conductive portion 80.

The conductive portion 80 consists of a contact 50 and a contact 70. The conductive portion 80 also serves as the electrode portions 31-34. That is, the conductive portion 80 includes the electrode portions 31-34, the contact 50 and the contact 70. The contact 50 in the present example is formed on the upper surface of the insulating film 40. However, at least a part of the contact 70 extends below the insulating film 40. In this manner, the Hall element 100 in the present example can suppress current concentration in the vicinity of the point at which the side surface of the contact 50 closer to the center 25 and the outermost surface of the magnetosensitive portion 20 are in contact.

The fabrication method of the Hall element 100 in the present example is different from that of the Hall element 100 according to FIG. 14. According to the fabrication method of the Hall element 100 in the present example, the insulating film 40 is formed on the magnetosensitive portion 20, and openings for connecting the magnetosensitive portion 20 and the conductive portion 80 is formed in the insulating film 40. Subsequently, the conductive portion 80 is formed on the insulating film 40. In the present example, as it is not required to perform film formation of the electrode portions 31-34 and the contacts 50 in separated processes, the conductive portion 80 is formed at one time and therefore the number of fabrication steps can be reduced. In the case of providing the conductive portion 80 as well, the contact 70 is formed between the magnetosensitive portion 20 and the conductive portion 80 by annealing the conductive portion 80. Note that a portion detected, by performing an elementary analysis such as SEM-EDX or TEM-EDX on a cross section of the Hall element 100, to contain electrode materials of the conductive portion 80 is determined to be the contact.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A Hall sensor comprising:
a substrate;
a magnetosensitive portion formed on the substrate;
an insulating film formed on the magnetosensitive portion;
an electrode portion formed on the insulating film; and
a ball portion which is provided on the electrode portion above an area of the magnetosensitive portion that does not overlap in plan view with an area of a contacting region at which the magnetosensitive portion and the electrode portion are in contact, and is electrically connected to the electrode portion, wherein
in plan view, a projection area of the ball portion accounts for 10% or more of a projection area of the magnetosensitive portion.

2. The Hall sensor according to claim 1, wherein the projection area of the ball portion accounts for 20% or more of the projection area of the magnetosensitive portion.

3. The Hall sensor according to claim 1, further comprising a bonding wire which is electrically connected to the ball portion and is extended from the ball portion in a direction perpendicular to an upper surface of the electrode portion.

4. The Hall sensor according to claim 3, wherein the bonding wire is extended perpendicularly from one surface of the electrode portion by 5% or more of a diameter of the ball portion.

5. The Hall sensor according to claim 1, wherein the ball portion is formed of gold.

6. The Hall sensor according to claim 1, further comprising a dummy ball which is provided on the electrode portion and is not connected to a bonding wire.

7. The Hall sensor according to claim 1, further comprising a contact which penetrates the insulating film and electrically connects the electrode portion and the magnetosensitive portion, wherein some of the ball portion is formed on the contact.

8. The Hall sensor according to claim 1, wherein the magnetosensitive portion has a rectangular planar shape.

9. The Hall sensor according to claim 1, wherein the ball portions blocks light incident to the area of the magnetosensitive portion that does not overlap in plan view with the area of the contacting region, by absorbing or reflecting light.

10. The Hall sensor according to claim 1, wherein the ball portion overlaps the insulating film in plan view.

\* \* \* \* \*